United States Patent
Tsuchi

(10) Patent No.: US 7,619,445 B2
(45) Date of Patent: Nov. 17, 2009

(54) DIFFERENTIAL AMPLIFIER, DIGITAL-TO-ANALOG CONVERTER AND DISPLAY APPARATUS

(75) Inventor: Hiroshi Tsuchi, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 12/166,098

(22) Filed: Jul. 1, 2008

(65) Prior Publication Data
US 2008/0265942 A1 Oct. 30, 2008

Related U.S. Application Data

(63) Continuation of application No. 11/093,245, filed on Mar. 29, 2005, now abandoned.

(30) Foreign Application Priority Data
Mar. 29, 2004 (JP) ............................. 2004-096524

(51) Int. Cl.
*H03K 19/0175* (2006.01)
(52) U.S. Cl. ........................................ 326/82; 345/204
(58) Field of Classification Search .................. 326/26, 326/27, 82–86; 345/204
See application file for complete search history.

(56) References Cited

U.S. PATENT DOCUMENTS

| 7,053,695 | B2 | 5/2006 | Ozasa et al. |
| 7,081,792 | B2 | 7/2006 | Kasai et al. |
| 7,091,757 | B2 | 8/2006 | Masuda |
| 7,113,017 | B2 | 9/2006 | Owen |
| 7,190,214 | B2 | 3/2007 | Barnett et al. |
| 7,288,971 | B1 | 10/2007 | Plasterer et al. |
| 7,301,370 | B1 | 11/2007 | Hanna et al. |
| 7,348,824 | B2 | 3/2008 | Naviasky et al. |
| 7,532,144 | B2 * | 5/2009 | Yamaji et al. ............... 341/156 |
| 2008/0169839 | A1 * | 7/2008 | Abadeer et al. ............... 326/82 |
| 2009/0058527 | A1 * | 3/2009 | Srinivasa et al. ............ 330/259 |

FOREIGN PATENT DOCUMENTS

| JP | 2001-292041 A | 10/2001 |
| JP | 2003-168936 A | 6/2003 |

* cited by examiner

*Primary Examiner*—Don P Le
(74) *Attorney, Agent, or Firm*—Scully, Scott, Murphy & Presser, P.C.

(57) ABSTRACT

A differential amplifier includes a first differential pair, a second differential pair, a load circuit, connected in common to the first and second differential pairs, and first and second current sources for supplying the current to the first and second differential pairs, and amplifies a signal responsive to a common output signal of the first and second differential pairs. One of differential inputs of the first differential pair is connected to a reference voltage. A data output period includes a first period and a second period. During the first period, voltages of first and second input terminals are input through first and fourth switches in the on-state to differential inputs of the second differential pair. The other of the differential inputs of the first differential pair is connected through a third switch in the on-state to an output terminal. An output voltage is stored in a capacitor C connected to the other differential input of the first differential pair. The first, third and fourth switches are turned off during the second period. One of the differential inputs of the second differential pair is connected through a second switch to the output terminal. The other differential input of the second differential pair is connected through a fifth switch to a third input terminal.

28 Claims, 19 Drawing Sheets

| LEVEL | INPUT VOLTAGE | V(T1) | V(T2) | V(T3) | D1,D0 |
|---|---|---|---|---|---|
| 1 |  | A | B | A | 0,0 |
| 2 | A | A | B | B | 0,1 |
| 3 | B | B | A | A | 1,0 |
| 4 |  | B | A | B | 1,1 |

| LEVEL | INPUT VOLTAGE | V(T1)=V(T3) | V(T2) | D1,D0 |
|---|---|---|---|---|
| 1 | | A | B | 0,0 |
| 2 | A | A | A | 0,1 |
| 3 | B | B | B | 1,0 |
| 4 | | B | A | 1,1 |

US 7,619,445 B2

DIFFERENTIAL AMPLIFIER, DIGITAL-TO-ANALOG CONVERTER AND DISPLAY APPARATUS

RELATED APPLICATION

This application is a continuation of U.S. patent application Ser. No. 11/093,245, filed Mar. 29, 2005.

FIELD OF THE INVENTION

This invention relates to a multi-valued outputting type differential amplifier, a digital-to-analog converter and a display apparatus.

BACKGROUND OF THE INVENTION

Recently, a flat panel display, such as a liquid crystal display, has become popular. FIG. 22 shows a general configuration of a data driver for outputting a level voltage to a data line of a display unit based on video signal. Referring to FIG. 22, this data driver at least includes a grayscale voltage generating circuit 920, a plural number of decoders 930 (selection circuits), and a plural number of buffer circuits 910. The grayscale voltage generating circuit 920 is formed by a resistor string, connected between a power supply VA and another power supply VB, and outputs a plural number of grayscale voltages, corresponding to the number of the grayscales, from respective terminals (taps) of the resistor string. Each decoders 930 is supplied with the grayscale voltages and a digital video signal and selects the grayscale voltage associated with the digital video signal to output the so selected grayscale voltage to the buffer circuit 910. Each buffer circuit 910 current-amplifies the grayscale voltage for outputting to an output terminal. The decoders 930 and the buffer circuits 910 are provided for the respective outputs and the grayscale voltage generating circuit 920 is co-owned by all of these outputs. The video signal supplied to the decoder 930 are digital video signal processed e.g. by a data register, a latch or by a level shifter, not shown.

Since it is requested for the data driver to output the grayscale voltages free of variations to a number of data lines, high output voltage accuracy is required of the buffer circuits 910. For the buffer circuits, the configuration shown for example in FIGS. 23 and 25 has been proposed (see Patent Publications 1 and 2, indicated below).

The differential amplifier circuit, shown in FIG. 23, is an offset canceling amplifier, having the function of suppressing the output offset ascribable to variations in transistor devices making up the circuit. FIG. 23 shows the configuration disclosed in the Patent Publication 1 as later explained, and FIG. 24 is a timing diagram showing the switch on/off of the circuit of FIG. 23.

Referring to a timing chart of FIG. 24, in a circuit shown in FIG. 23, switches SW1 and SW3 are turned on, whilst a switch SW2 is turned off, during a time period t1 of one data output period. An input voltage Vin and an output voltage Vout are supplied to an input pair of a differential pair (M3, M4). The input voltage Vin is also supplied to another input pair of a differential pair (M5, M6). At this time, the output voltage Vout is a voltage including an offset voltage Vf (Vin+Vf), this voltage Vf being stored in a capacitor C1.

Then, during the time period t2, the switches SW1 and SW3 are turned off, whilst the switch SW2 is turned on. The input voltage Vin and a voltage stored in the capacitor C1 (Vin+Vf) are supplied to the input pair of the differential pair (M3, M4), whilst the input voltage Vin and the output voltage Vout are supplied to the input pair of the differential pair (M5, M6).

At this time, the same voltage as that during the time period t1 is supplied to the input pair of the differential pair (M3, M4) to maintain the differential pair (M5, M6) in the same state as that during the time period t1. Consequently, the output voltage Vout during the time period t2 is equal to the input voltage Vin and remains stable. Thus, in the circuit configuration, shown in FIG. 23, the output offset may be canceled, so that a voltage equal to the input voltage may be amplified to output the so amplified voltage.

The configuration shown in FIG. 25 is a modification of the configuration of FIG. 23. The point of change is that a reference voltage Vref is applied to the gate of the transistor M3 of the differential pair. The timing chart in controlling the respective switches of FIG. 25 is the same as that shown in FIG. 24.

Referring to FIG. 25, the switches SW1 and SW3 are turned on and the switch SW2 is turned off, during one data outputting time period t1. The input voltage Vin and the reference voltage Vref are supplied to the input pair of the differential pair (M3, M4), and an input voltage Vin is supplied common to the input pair of the differential pair (M5, M6). At this time, the output voltage Vout is a voltage corresponding to the reference voltage Vref added by the offset voltage Vf (Vref+Vf), and is stored in the capacitor C1.

Then, during the time period t2, the switches SW1, SW3 are turned off, whilst the switch SW2 is turned on. The input voltage Vin and the voltage stored in the capacitor C1 (Vref+Vf) are supplied to the input pair of the differential pair (M3, M4), whilst the input voltage Vin and the output voltage Vout are supplied to the input pair of the differential pair (M5, M6).

At this time, the input pair of the differential pair M3, M4 is supplied with the same voltage as that supplied during the time period t1 to maintain the differential pair (M5, M6) in the same state as that during the time period t1. Hence, the output voltage Vout during the time period t2 is stable at a voltage equal to the input voltage Vin. That is, with the configuration shown in FIG. 25, it is again possible to cancel out the output offset to amplify a voltage equal to the input voltage to output the so amplified voltage.

Meanwhile, the reference voltage Vref may be set to a mid value of the output voltage range of the amplifier circuit to reduce the potential variations of the output voltage Vout during the time period t1 to a value smaller than in the case of FIG. 23. This allows shortening the time period t1 and elongating the time period t2 of high accuracy driving.

[Patent Publication 1]
Japanese Patent Kokai Publication No. JP-P2001-292041A (FIG. 1)

[Patent Publication 2]
Japanese Patent Kokai Publication No. JP-P2003-168936A (FIG. 1)

SUMMARY OF THE DISCLOSURE

Recently, the tendency in a liquid crystal display device is to enhance the number of grayscales (colors), such that 64 grayscales (260000 colors) to 256 grayscales (16800000 colors) and even 1024 grayscales (1070000000 colors) are realized. If the tendency towards multi-grayscale progresses further, the number of grayscale voltage lines corresponding to the number of the grayscales is needed in the data driver configuration shown in FIG. 22, whilst the number of the transistors for selecting the grayscale voltages is increased, thus increasing the decoder area.

This requirement cannot be met with the offset canceling amplifier shown in FIG. 23 or 25.

For solving the above problem, such a multi-valued output amplifier, capable of outputting a large number of output levels with a smaller number of input levels, is needed.

Accordingly it is an object of the present invention to provide a multi-value outputting type differential amplifier, a digital-to-analog converter and a display apparatus, in which it is possible to reduce the decoder area and to enable high-accuracy output.

It is another object of the present invention to provide a multi-valued outputting type differential amplifier, a digital-to-analog converter and a display apparatus, in which it is possible to suppress variations in the slew rate otherwise caused by device-based variations.

The above and other objects are attained by a differential amplifier circuit in accordance with one aspect of the present invention, which comprises: an input differential stage including a first differential pair, a second differential pair, and at least one load circuit connected to output pairs of the first and second differential pairs, and an amplifier stage receiving a common output signal of the first and second differential pairs for charging or discharging an output terminal, wherein the differential amplifier circuit further comprises a control circuit for controlling the switching between a first state in which the output terminal is connected in a feedback fashion to one of differential inputs of the first differential pair, the voltage at the output terminal is stored in a capacitor connected to one of the differential inputs of the first differential pair, and in which first and second voltages are supplied to differential inputs of the second differential pair, and a second state in which the output terminal is connected in a feedback fashion to one of differential inputs of the second differential pair, a third voltage is applied to the other of the differential inputs of the second differential pair, and in which the one of the differential inputs of the first differential pair is disconnected from the output terminal, and wherein a preset reference voltage is supplied to the other of the differential inputs of the first differential pair.

A differential amplifier circuit in accordance with another aspect of the present invention, comprises an input differential stage including a first differential pair, a second differential pair, and at least one load circuit connected to output pairs of the first and second differential pairs, and an amplifier stage receiving a common output signal of the first and second differential pairs for charging or discharging an output terminal, wherein the differential amplifier circuit further comprises a control circuit for controlling the switching between a first state in which the output terminal is connected in a feedback fashion to one of differential inputs of the first differential pair, the voltage at the output terminal is stored in a capacitor connected to one of the differential inputs of the first differential pair, and in which first and second voltages are supplied to differential inputs of the second differential pair, and a second state in which the output terminal is connected in a feedback fashion to one of the differential inputs of the second differential pair, one of the first voltage and the second voltage is applied to the other of the differential inputs of the second differential pair, and in which the one of the differential inputs of the first differential pair is disconnected from the output terminal, and wherein a preset reference voltage is supplied to the other of the differential inputs of the first differential pair.

In a further aspect, the present invention provides a differential amplifier circuit comprising first and second differential pairs, a load circuit connected in common to the first and second differential pairs, and first and second current sources for supplying currents to the first and second differential pairs. The differential amplifier circuit performs an amplification operation responsive to a common output signal of the first and second differential pairs. A preset reference voltage is supplied to one of differential inputs of the first differential pair. A data output period includes a first period and a second period. In the first period, voltages of first and second input terminals are supplied through first and fourth switches, respectively, to differential inputs of the second differential pair. The other of the differential inputs of the first differential pair is connected to a third switch in an on-state to an output terminal of the differential amplifier circuit; the voltage of the output terminal is stored in a capacitor connected to the other of the differential inputs of the first differential pair. In the second period, the first, third and fourth switches are all turned off. One of differential inputs of the second differential pair is connected to the output terminal via a second switch in an on-state, and the other of the differential inputs of the second differential pair is connected via a fifth switch to a third input terminal.

In a further aspect, the present invention provides a differential amplifier circuit comprising first and second differential pairs, a load circuit connected in common to the first and second differential pairs, and first and second current sources for supplying currents to the first and second differential pairs. The differential amplifier circuit performs an amplification operation responsive to a common output signal of the first and second differential pairs. A preset reference voltage is supplied to one of differential inputs of the first differential pair. A data output period includes a first period and a second period. In the first period, voltages of first and second input terminals are supplied through first and fourth switches, respectively, to differential inputs of the second differential pair. The other of the differential inputs of the first differential pair is connected to a third switch in an on-state to an output terminal of the differential amplifier circuit. The voltage of the output terminal is stored in a capacitor connected to the other of the differential inputs of the first differential pair. In the second period, the first, third and fourth switches are all turned off. One of differential inputs of the second differential pair is connected to the output terminal via a second switch in an on-state, and the other of the differential inputs of the second differential pair is connected via a fifth switch to the first input terminal.

In the present invention, there may be provided a circuit for controlling activation/non-activation of at least one of the first and second differential pairs.

In the present invention, there may be provided a circuit for controlling activation/non-activation of at least one of the first and second current sources.

According to the present invention, the differential amplifier circuit may further comprise a sixth switch connected between the first differential pair and the second power supply in series with the first current source, and a seventh switch connected between the second differential pair and the second power supply in series with the second current source. In the present invention, in the first period of the data output period, the seventh switch is turned off for a preset time duration as from the start of the first period and subsequently turned off, whilst the sixth switch is turned off for a preset time as from the start of the second period and turned on during the time other than the preset time as from the start of the second period of the data output period.

According to the present invention, the sixth switch and a third current source, connected in parallel with the first current source, may be provided across the first differential pair and a second power supply, whilst the seventh switch and a fourth current source, connected in parallel with the second current source, may be provided across the second differential pair and the second power supply. In the present invention, in the first period of the data output period, the sixth switch is turned on for a preset time duration as from the start of the first period and subsequently turned off, whilst the seventh switch is turned on for a preset time as from the start of the second period and turned off during the time other than the preset time as from the start of the second period of the data output period.

According to the present invention, the sixth and seventh switches may be provided for on/off controlling the connection across the output pair of the first differential pair and the load circuit, whilst eighth and ninth switches may be provided for on/off controlling the connection across the output pair of the second differential pair and the load circuit.

According to the present invention, the eighth and ninth switches are turned off during a preset period as from the start of the first period of the data output period, whilst the sixth and seventh switches are turned off for a preset period as from the start of the second period and are turned on during the time other than the preset time as from the start of the second period of the data output period.

A digital-to-analog converter, in accordance with a further aspect, the present invention, comprises the differential amplifier circuit of the present invention, defined as described above, a set of resistors, connected in series across the high-side first potential and the low-side second potential, and a second selection circuit supplied with the potential from each tap of the set of resistors for selecting the potential supplied to the first to third terminals or to the first and second terminals based on an input data signal.

A display apparatus, in accordance with a further aspect, the present invention, comprises the above-described differential amplifier circuit of the present invention as an amplifier circuit for driving data lines supplied with the grayscale voltages and connected to display devices.

The meritorious effects of the present invention are summarized as follows.

The present invention has such meritorious effects that, by the differential amplifier capable of outputting a voltage to high accuracy against manufacture tolerances of device characteristics and also capable of providing multi-valued output voltages, the number of grayscale voltages supplied to the decoder or the number of transistors making up a decoder may be reduced to realize floor space area saving of the digital-to-analog converter.

Still other objects and advantages of the present invention will become readily apparent to those skilled in this art from the following detailed description in conjunction with the accompanying drawings wherein only the preferred embodiments of the invention are shown and described, simply by way of illustration of the best mode contemplated of carrying out this invention. As will be realized, the invention is capable of other and different embodiments, and its several details are capable of modifications in various obvious respects, all without departing from the invention. Accordingly, the drawing and description are to be regarded as illustrative in nature, and not as restrictive.

PREFERRED EMBODIMENTS OF THE INVENTION

Figure 1:
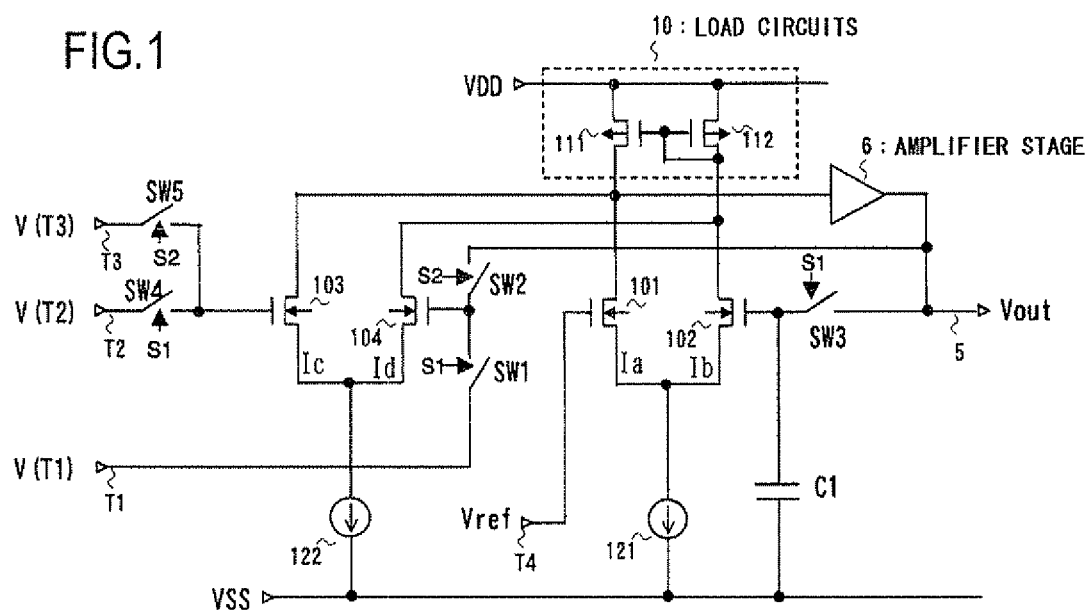
FIG. 1 is a diagram showing the configuration of a first embodiment of the present invention.

Referring to the drawings, preferred embodiments of the present invention are described in detail. It is noted that the same reference symbols are used throughout the drawings for depicting the same component elements.

FIG. 1 shows the configuration of a differential amplifier according to a first embodiment of the present invention.

Referring to FIG. 1, the differential amplifier according to the present embodiment has a configuration in which a first differential pair (101, 102), driven by a first current source 121, and a second differential pair (103, 104), driven by a second current source 122, with the first and second differential pairs being connected in common to a load circuit 10. The gate of the transistor 101 of the first differential pair is connected to a terminal T4 supplied with a reference voltage Vref, while the gate of the other transistor 102 of the first differential pair is connected via a switch SW3 to an output terminal 5.

The gate of the transistor 103 of the second differential pair is connected, via switches SW4 and SW5, to terminals T2 and T3, supplied with a voltage V(T2) and a voltage V(T3), respectively. The gate of the other transistor 104 of the second differential pair is connected via switches SW1 and SW2 to a terminal T1, supplied with a voltage V(T1), and to the output terminal 5, respectively.

A capacitor C1 is connected between the gate of the other transistor 102 of the first differential pair and a low potential power supply VSS.

An amplifier stage 6 is connected between the output terminal 5 and an output end of the first and second differential pairs (coupled drains of the transistors 101 and 103).

Specifically, the load circuit 10 is made up by e.g. a current mirror circuit 11, 112. An input end of the current mirror circuit (drain-gate connection node of a transistor 112) is connected to the coupled drains of the other transistors 102 and 104 of the first and second differential pairs, whilst an output end of the current mirror circuit (drain of the transistor 111) is connected to the coupled drains of the transistors 101 and 103 of the first and second differential pairs.

The differential amplifier of the present embodiment, shown in FIG. 1, is able to output a voltage, associated with the voltages V(T1), V(T2) and V(T3), to high accuracy, irrespective of variations in transistor characteristics. The operation is now explained with reference to FIG. 2.

Figure 2:
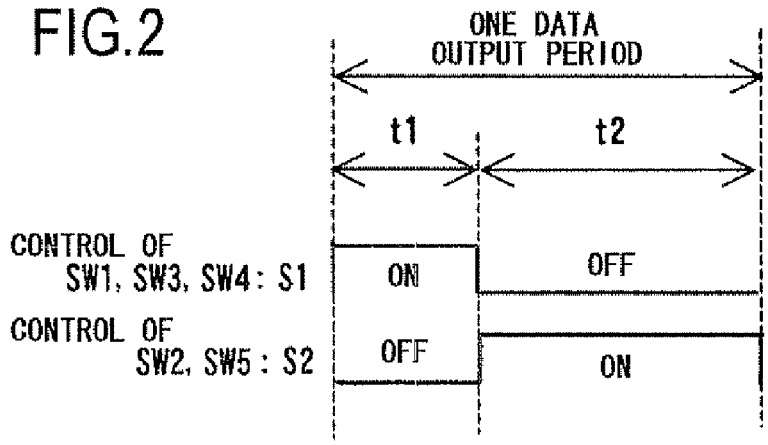
FIG. 2 is a timing diagram showing an example of switch control according to the first embodiment of the present invention.

FIG. 2 is a timing chart for control signals S1 and S2 used for controlling the respective switches of the differential amplifier of FIG. 1 during one data output period. In FIG. 1, the switches SW1, SW3 and SW4 are on/off controlled by the control signal S1, whilst the switches SW2 and SW5 are on/off controlled by the control signal 82. One data output period is divided into two periods t1, t2.

First, during the period t1, the switches SW1, SW3 and SW4 are turned on, whilst the switches SW2 and SW5 are turned off. At this time, the first differential pair (101, 102) is in a configuration of feedback connection. That is, the reference voltage Vref is supplied to a non-inverting terminal of the first differential pair (101, 102) (gate of transistor 101), whilst the output voltage Vout is fed back to an inverting input end (gate of transistor 102). Hence, the output voltage Vout is changed to a voltage associated with the reference voltage Vref supplied to the gate of the transistor 101. However, since the output end of the first differential pair (101, 102) is connected in common to the output end of the second differential pair (103, 104), the output voltage Vout is affected by the voltages V(T2), V(T1), supplied to the differential input pair of the second differential pair (103, 104), while being affected by variations in the characteristics of the transistors making up the circuitry.

That is, during the period t1, the output voltage Vout is a voltage affected by the reference voltage Vref and the voltages V(T2) and V(T1), and by variations in the transistor characteristics, and may be expressed by the following equation (1):

$$Vout = Vref + \Delta V \quad (1)$$

where $\Delta V$ denotes voltage offset from the reference voltage Vref.

If the currents flowing through the transistors of the first differential pair (101, 102) and the second differential pair (103, 104) are labeled Ia, Ib, Ic and Id, respectively, the following equation (2):

$$Ia + Ib = Ib + Id + \Delta I \quad (2)$$

is obtained from the relationship of the input and output currents of the current mirror circuit 111, 112 for the stable state of the period t1 where $\Delta I$ denotes a current offset caused by variations in characteristics across the paired transistors of the current mirror circuit 111, 112.

During the next period t2, the switches SW1, SW3 and SW4 are turned off, while the switches SW2 and SW5 are turned on.

At this time, the output voltage (Vref+$\Delta V$) for the first period t1 is held in the capacitor C1, whilst the reference voltage Vref and (Vref+$\Delta V$) are supplied to the differential input pair of the first differential pair (101, 102).

On the other hand, the second differential pair (103, 104) is in a feedback connection configuration in which the voltage V(T3) and the output voltage Vout are supplied to the non-inverting input end and the inverting input end thereof, respectively. Thus, the output voltage Vout is changed to a voltage associated with the voltage V(T3) supplied to the gate of the transistor 103.

However, the voltage supplied to the differential input pair of the first differential pair (101, 102) remains the same throughout the periods t1 and t2, such that there occurs no state change. Consequently, the stable state of the second differential pair (103, 104) during the period t2 is maintained so as to be approximately the same as that during the period t1. That is, the states of the current flowing through the respective transistors of the first differential pair (101, 102) and the second differential pair (103, 104) are kept to be the same for the periods t1 and t2.

On the other hand, the relationship between the two input voltages to the differential input pair and the current flowing through the differential pair is such that, if the two input voltages are changed relatively slightly as the potential difference is kept between the two input voltages, the current flowing through the differential pair is not changed.

The reason is that the common source potential of the differential pair is changed with changes in the two input voltages to maintain the constant gate-to-source voltages of the transistor pair of the differential pair.

Hence, the two input voltages to the second differential pair (103, 104) during the terms t1 and t2 satisfy the relation of the following equation (3):

$$V(T2) - V(T1) = VT(3) - Vout \quad (3)$$

In the above equation (3), the left term and the right term represent the potential difference of the two input voltages during the periods t1 and t2, respectively. Consequently, the output voltage Vout is expressed by the following equation (4):

$$Vout = V(T3) + \{V(T1) - V(T2)\} \quad (4)$$

In the above equation (4), $\{V(T1) - V(T2)\}$ may be regarded as being a level shift value.

The differential amplifier of FIG. 1 is able to current-amplify the voltage which is a voltage level-shifted from the voltage V(T3) in accordance with the voltage V(T1) and the voltage V(T2). In addition, the differential amplifier of FIG. 1 is able to output the voltage to high accuracy without regard to variations in the transistor characteristics.

Meanwhile, it is only sufficient that the reference voltage Vref remains constant during the periods t1 and t2, such that any suitable constant voltage, allowing for operation of the first differential pair (101, 102), may be used.

It is noted that any of the voltages V(T1), V(T2) and V(T3) may be used as the reference voltage Vref.

It is to be noted that a differential amplifier, reversed in polarity from the configuration of FIG. 1, gives the same operation and results. That is, in FIG. 1, the first differential pair (101, 102) and the second differential pair (103, 104) are formed by NMOS transistors, while the current mirror (111, 112) is formed by PMOS transistors. Alternatively, the transistors may be reversed in polarity, that is, the first differential pair (101, 102) and the second differential pair (103, 104) may be formed by PMOS transistors, while the current mirror (I11, I12) may be formed by NMOS transistors. In the respective figures, inclusive of FIG. 1, the capacitor C1 has one end connected to the gate of the other transistor 102 of the first differential pair, while having the other end connected to the low voltage side power supply VSS. However, the other end of the capacitor C1 may also be connected to a high voltage side power supply VDD or to any suitable power supply, instead of to the low voltage side power supply VSS. In the embodiment illustrated, the simplest case is shown in which the respective switches of FIG. 1 are controlled by the two signals S1 and S2 shown in FIG. 2. However, in case the switches exhibit parasitic capacitances and the effect of the capacitive coupling cannot be disregarded during the switch operation, separate control signals slightly offset in timing from S1 and S2 may be used as necessary.

Figure 3:
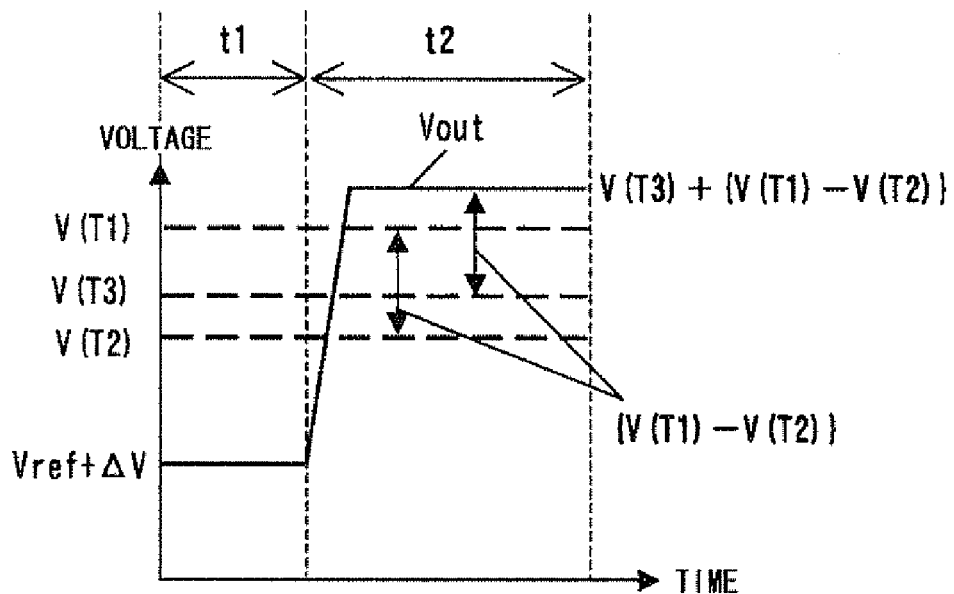
FIG. 3 is a waveform diagram for illustrating the operation of the first embodiment of the present invention.

FIG. 3 is a voltage waveform diagram showing the state of output changes of the differential amplifier shown in FIG. 1. FIG. 3 shows a case in which the voltages V(T1), V(T2), V(T3) and Vref have been set to respective different values.

The output voltage Vout is as indicated by the above equations (1) and (4) for the periods t1 and t2, respectively.

The potential difference between the voltage Vout and V(T3) during the period t2 is maintained at a potential difference between the voltages V(T1) and V(T2).

That is, from the above equation (4), we have:

$$Vout - V(T3) = V(T1) - V(T2)$$

By allotting proper voltage values to V(T1), V(T2) and V(T3), a desired voltage may be output as the voltage Vout for the period t2. The differential amplifier of FIG. 1 may be configured for outputting multiple output values, that is, for issuing a plural number of output voltages larger than the number of the input voltages.

Figures 4A, 4B:
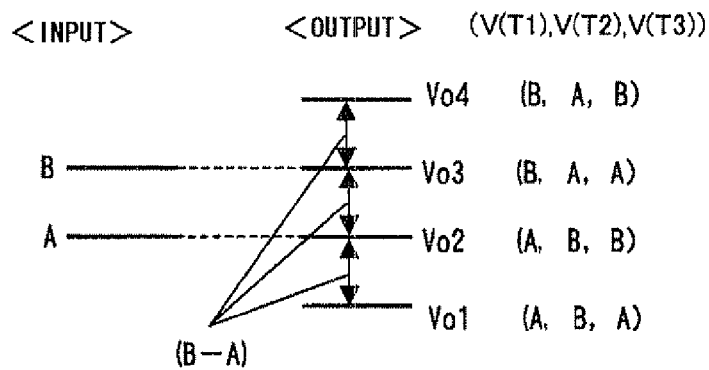
FIGS. 4A and 4B illustrate an example of multi-valued outputting by a differential amplifier according to the first embodiment of the present invention.

FIGS. 4A and 4B illustrate an embodiment for multi-valued outputting by the differential amplifier of FIG. 1. Specifically, FIG. 4A shows the relation between the input level and the output level and FIG. 4B shows the states of voltage selection correlated with 2-bit digital data (D1, D0). Most simply, FIG. 4A shows a case where the input voltage has two levels of voltages A and B. By selectively inputting the voltages A and B to the voltages V(T1), V(T2) and V(T3), four levels of Vo1 to Vo4 may be output as output levels.

Specifically, for outputting the voltage Vo1, (V(T1), V(T2), V(T3))=(A, B, A) is selected.

Then, from the above equation (4), we have:

$$Vo1 = \{A - (B - A)\}$$

That is, the voltage Vo1 is a voltage shifted by a potential difference (B−A) from the voltage A towards the low potential side.

For outputting the voltage Vo2, $$(V(T1), V(T2), V(T3)) = (A, B, B)$$

is selected.

Then, $$Vo2 = \{B - (B - A)\} = A$$

That is, the voltage Vo2 is a voltage shifted by a potential difference (B−A) from the voltage B towards the low potential side, and is equipotential to the voltage A.

For outputting the voltage Vo3, $$(V(T1), V(T2), V(T3)) = (B, A, A)$$

is selected.

Then, $$Vo3 = \{A + (B - A)\} = B$$

That is, the voltage Vo3 is a voltage shifted by a potential difference (B−A) from the voltage A towards the high potential side, and is equipotential to the voltage B.

For outputting the voltage Vo4, $$(V(T1), V(T2), V(T3)) = (B, A, B)$$

is selected.

Then, $$Vo4 = \{B + (B - A)\} = B$$

That is, the voltage Vo4 is a voltage shifted by a potential difference (B−A) from the voltage B towards the high potential side.

In case selection is made as shown in FIG. 4A, four voltage levels are possible for two input voltages. In this case, the spacing between the neighboring levels may be kept to a constant potential difference of (B−A).

It is also possible to selectively output four voltages Vo1 to Vo4 by 2-bit digital data (D1, D0), as shown in FIG. 4B.

Figures 5A, 5B:
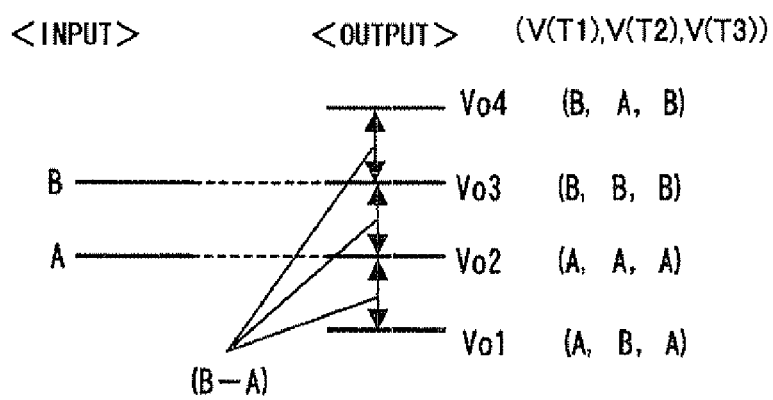
FIGS. 5A and 5B illustrate another example of multi-valued outputting by a differential amplifier according to the first embodiment of the present invention.

FIGS. 5A and 5B illustrate an embodiment for multi-valued output, different from the case of FIGS. 4A and 4B, by the differential amplifier of FIG. 1.

FIG. 5A shows the relationship of the input/output level, and FIG. 5B shows the states of voltage selection correlated with 2-bit digital data (D1, D0).

FIG. 5A again shows a case where the input voltage is of two levels, namely a voltage A and a voltage B. Four levels of Vo1 to Vo4 may be output by selectively inputting the voltages A and B for the voltages V(T1), V(T2), V(T3).

The point of difference from the example shown in FIGS. 4A and 4B are the selecting conditions for outputting Vo2 and Vo3. Specifically, when (V(T1), V(T2), V(T3))=(A, A, A) is selected in FIGS. 5A and 5B, for outputting the voltage Vo2, $$Vo2 = \{A - (A - A)\} = A$$

That is, the voltage Vo2 is equipotential to the voltage A, being a voltage level-shifted from the voltage A by a zero potential difference.

If, in outputting the voltage Vo3, $$(V(T1), V(T2), V(T3)) = (B, B, B)$$

is selected, $$Vo3\{B + (B - B)\} = B.$$

That is, the voltage Vo3 is equipotential to the voltage B, being a voltage level-shifted from the voltage B by a zero potential difference.

That is, if selection is made as shown in FIG. 5A, four-level voltages are possible for two input voltages, as in FIGS. 4A and 4B. At this time, the interval between the neighboring levels may be made a constant potential difference (B−A).

It is also possible to selectively output the four voltages Vo1 to Vo4 by 2-bit digital data (D1, D0), as shown in FIG. 5B.

That is, levels 1 to 4 are output responsive to 2-bit digital data (D1, D0)=(0, 0), (0, 1), (1, 0) and (1, 1).

Figure 6:
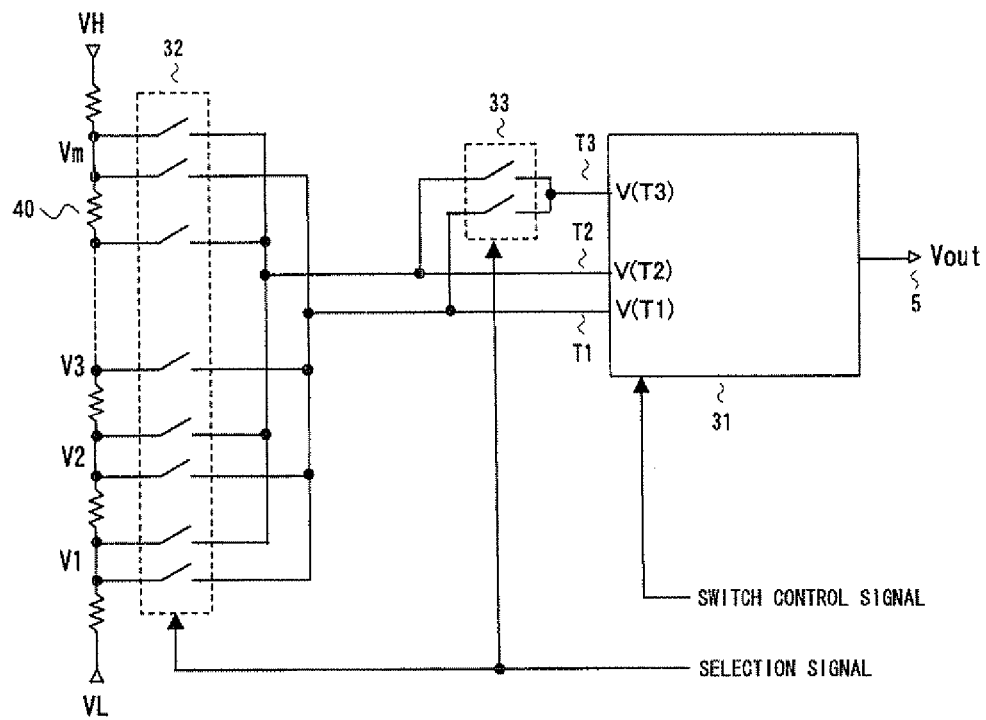
FIG. 6 is a diagram showing the configuration of a digital-to-analog converter according to the first embodiment of the present invention.

FIG. 6 shows the configuration of an embodiment of a digital-to-analog converter employing the differential amplifier of FIG. 1. In FIG. 6, the differential amplifier of the embodiment explained with reference to FIG. 1 is used as a circuit 31 (multi-valued output differential amplifier).

The circuit 31 is selectively supplied with m voltages V1 to Vm, which are generated by connection terminals of plural resistor devices 40, connected in series across power supply voltages VH and VL. The respective voltages are selected by a set of switches 32 and output to two terminals T1 and T2.

One of the voltages, output to the terminals T1 and T2, is selected by a set of switches 33 and output to a terminal T3.

A switch control signal is supplied to the circuit 31 to control the switches SW1 to SW5 of FIG. 1.

A selection signal is supplied to the sets of switches 32, 33, such that a voltage level associated with the selection signal is output to the terminals T1 to T3. As the selection signal, digital signal, such as video data, may be used.

As already explained with reference to FIGS. 4B and 5B, the circuit 31 (differential amplifier of FIG. 1) is able to output four level voltages for at least two different input voltages, depending on the selection conditions.

Consequently, a larger number of level voltages may be output by variably selecting m voltages V1 to Vm as inputs to V(T1), V(T2) and V(T3).

With the above-described digital-to-analog converter of FIG. 6, employing the differential amplifier of FIG. 1, a large number of output voltages may be obtained with a small number of input voltages, so that the number of switches for selecting the input voltage may be reduced and hence the circuit size may be reduced as compared to that of the conventional circuit having the same number of output levels.

Figure 7:
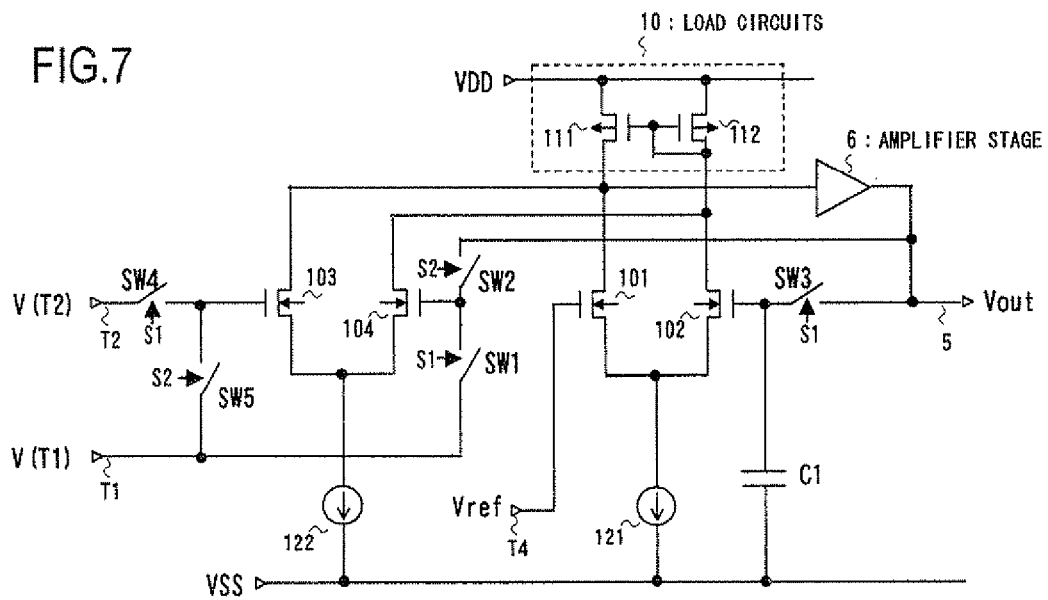
FIG. 7 is a diagram showing the configuration of a second embodiment of the present invention.

FIG. 7 shows a modification of the differential amplifier shown in FIG. 1. There is shown in FIG. 1 a configuration in which V(T3)=V(T1) at all times.

The configuration shown in FIG. 7 differs from that of FIG. 1 in the fact that the terminal T3 of FIG. 1 is removed and that the switch SW5 is connected between the terminals T1 and T2. The configuration of FIG. 7 is otherwise the same as that shown in FIG. 1.

The switches SW1 to SW5 are on/off controlled as shown in FIG. 2.

In the differential amplifier of FIG. 7, the output voltage Vout is expressed by the following equation (5):

$$V\text{out}-V(T1)=V(T1)-V(T2) \quad (5)$$

From the above equation (5), the output voltage Vout at all times is a voltage externally dividing the voltages V(T1), V(T2) by a ratio of 1:2, That is, the differential amplifier shown in FIG. 7 is able to output a voltage, corresponding to the external division of the voltages V(T1), V(T2) by the ratio of 1:2, as a voltage Vout, to high accuracy, without dependency on variations in transistor characteristics.

Meanwhile, the multi-valued output configuration of the differential amplifier shown in FIG. 7 is the same as that shown in FIGS. 5A and 5B.

Figure 8:
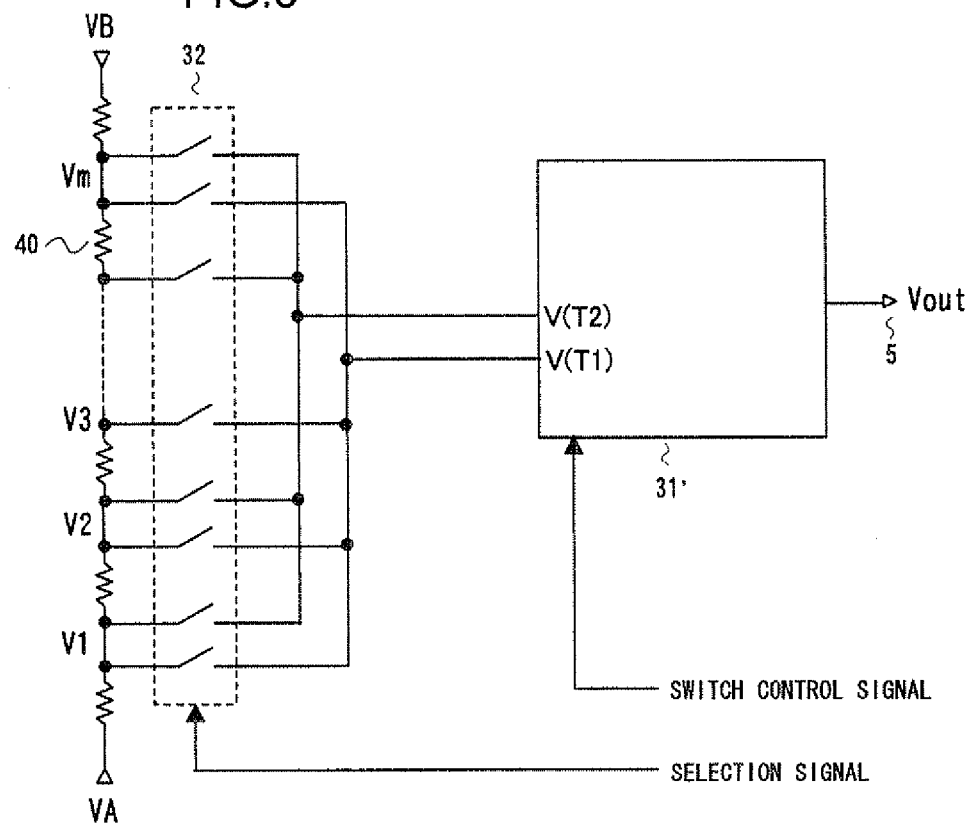
FIG. 8 is a diagram showing the configuration of a digital-to-analog converter having a differential amplifier according to the second embodiment of the present invention.

FIG. 8 shows the configuration of an embodiment of a digital-to-analog converter employing the differential amplifier of FIG. 7. The differential amplifier of FIG. 7 is used as a circuit 31'. In this case, the configuration shown in FIG. 8 is a configuration of FIG. 6 less the terminal T3 and the set of switches 33.

Consequently, the circuit size of the present embodiment may be smaller than that of the digital-to-analog converter of FIG. 6. That is, similarly to the digital-to-analog converter of FIG. 6, the digital-to-analog converter of FIG. 8, employing the differential amplifier of FIG. 7, may be smaller in circuit size than the conventional circuit having the same number of the output levels, because a large number of output voltages may be obtained with a smaller number of the input voltages and hence a smaller number of switches for selecting the input voltages suffices.

Figure 9:
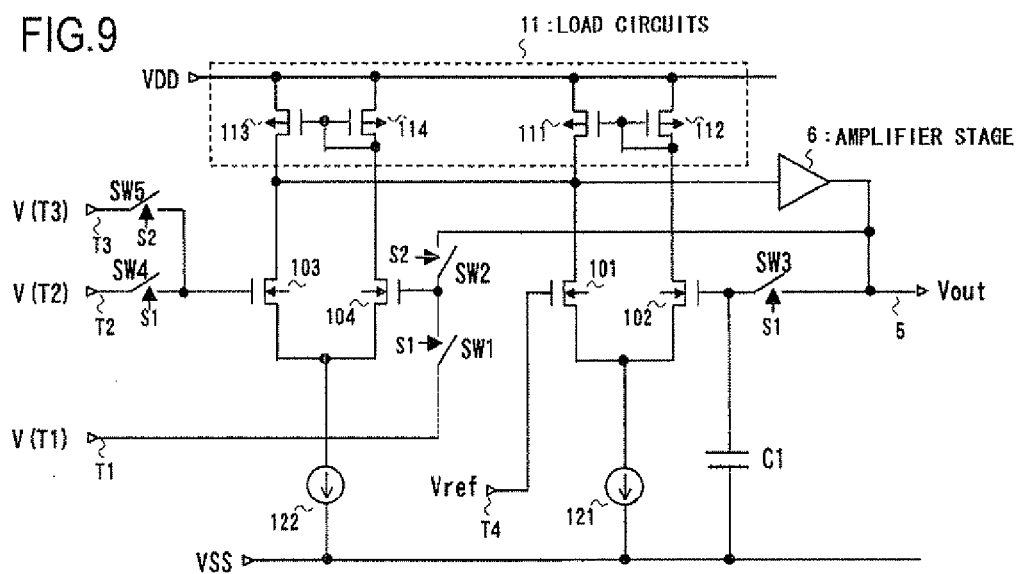
FIG. 9 is a diagram showing the configuration of a third embodiment of the present invention.

FIG. 9 shows a modification of FIG. 1, in which the load circuit 10 has been changed to a load circuit 11. In FIG. 9, the load circuit 11 is formed by a first current mirror (111, 112) and a second current mirror (113, 114), with the input and output ends of the current mirrors being connected to output pairs of the first differential pair (101, 102) and the second differential pair (103, 104). A connection node of the drain of the transistor 101 and the drain of the transistor 111 and a connection node of the drain of the transistor 103 and the drain of the transistor 113 are connected in common to form a common output end of the first differential pair (101, 102) and the second differential pair (103, 104).

In FIG. 9, the current relationship of the above equation (2) holds. In this case, ΔI is the sum of current offsets ascribable to variations in characteristics across the transistors of the transistor pairs of the first current mirror (111, 112) and the second current mirror (113, 114).

Hence, by the operation similar to that shown in FIG. 1, the differential amplifier shown in FIG. 9 is able to output a voltage, corresponding to the voltages V(T1), VT(2) and V(T3), to high accuracy, without regard to variations in transistor characteristics.

Figure 10:
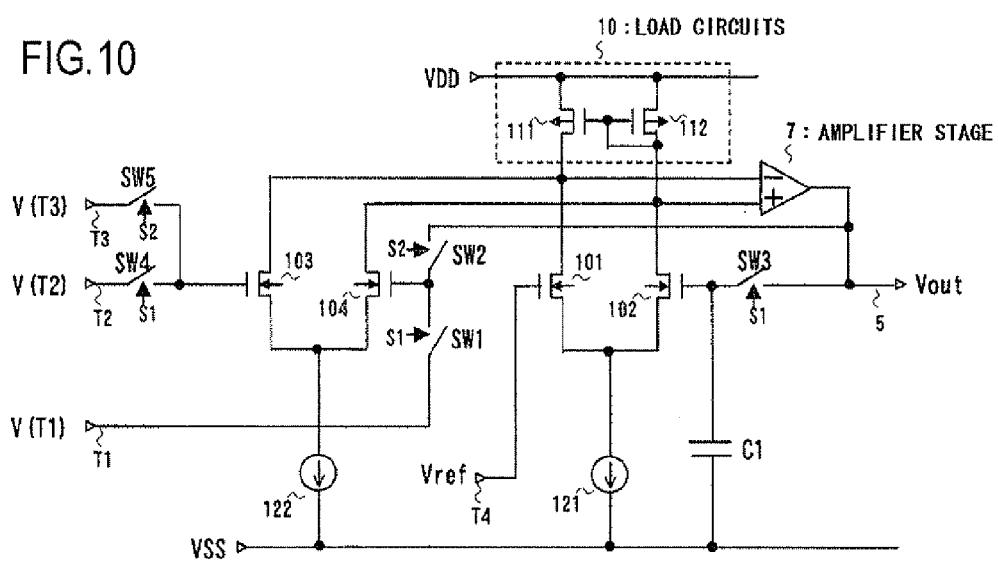
FIG. 10 is a diagram showing the configuration of a fourth embodiment of the present invention.

FIG. 10 shows a modification of the differential amplifier shown in FIG. 1. In the embodiment shown in FIG. 10, an amplifier stage 7 is substituted for the amplifier stage 6 of FIG. 1. In FIG. 10, the amplifier stage 7 is a differential amplifier stage having an input pair connected to one and the other common connection nodes of the first differential pair (101, 102) and the second differential pair (103, 104) and having an output end connected to the output terminal 5. The operation of the amplifier stage 7 is similar to that of the amplifier stage 6 of FIG. 1.

Figure 11:
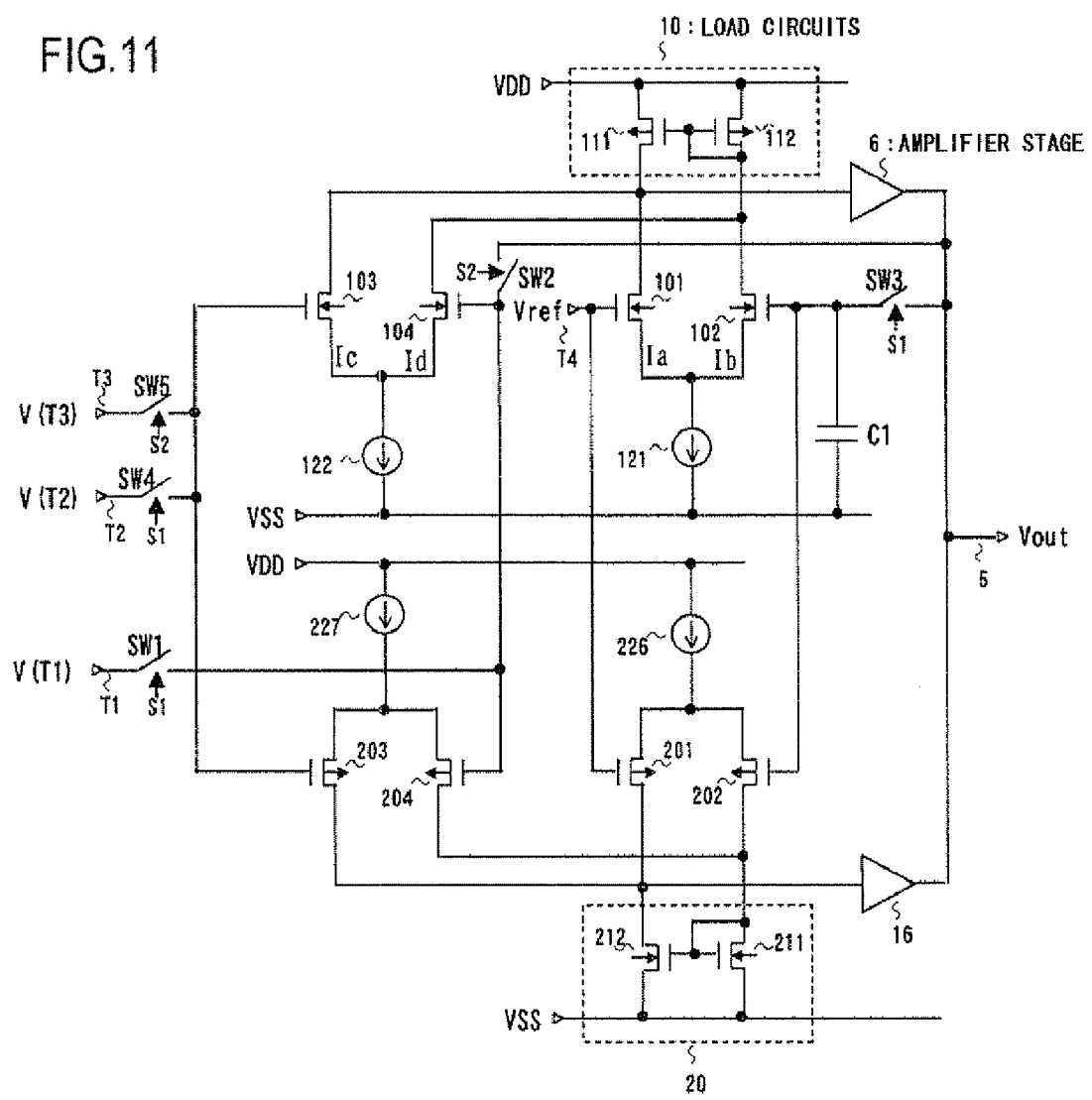
FIG. 11 is a diagram showing the configuration of a fifth embodiment of the present invention.

FIG. 11 shows a configuration of the combination of the differential amplifier shown in FIG. 1 and a differential amplifier the polarity of which is reversed from that of the differential amplifier of FIG. 1. Referring to FIG. 11, there are provided first and second nMOS differential pairs (101, 102) and (103, 104), a pMOS load circuit (111, 112), connected in common to the first and second differential pairs, first and second current sources (121, 122), supplying the current to the first and second differential pairs, third and fourth pMOS differential pairs (201, 202) and (203, 204), a nMOS load circuit (211, 212), connected in common to the third and fourth differential pairs, third and fourth current sources (226, 227), supplying the current to the third and fourth differential pairs, a first amplifier circuit 6 receiving a common output signal of the first and second differential pairs, and a second amplifier circuit 16 receiving a common output signal of the third and fourth differential pairs. The differential inputs of the first differential pair (101, 102) and the third differential pair (201, 202) are connected together, the differential inputs of the second differential pair (103, 104) and the fourth differential pair (203, 204) are connected together, and one differential inputs of the first differential pair (101, 102) and the third differential pair (201, 202) are connected to the reference voltage Vref. During the first period of the data output period, the voltages V(T1), V(T2) of the first and second input terminals T1, T2 are supplied to the differential inputs of the second and the fourth differential pairs, via first and fourth switches (SW1, SW4) in the on-state. The other of the differential inputs of the first and third differential pairs is connected to the output terminal 5 via third switch SW3 in the on-state, and the voltage at the output terminal is stored in a capacitor C1 connected to the other differential input of the first differential pair. During the second period, the first, third and fourth switches are all in the off-state, one of the differential inputs of the second and fourth differential pairs are connected to the output terminal 5 via the second switch SW2 in the on-state, and the other of the differential inputs of the second and fourth differential pairs are connected to the third input terminal T3 via fifth switch SW5 in the on-state.

Referring to FIG. 11, the first nMOS differential pair (101, 102) and the second nMOS differential pair (103, 104) have respective input pairs connected in common to the first pMOS differential pairs (201, 202) and to the second pMOS differential pairs (203, 204), and hence the switches SW1 to SW5 and the capacitor C1 do not have to be provided separately to the two differential amplifiers but may be co-owned by these differential amplifiers. Although FIG. 11 shows a configuration of separately providing the amplifier stages 6, 16, it is of course possible to interconnect the amplifier stages 6 and 16 by, for example, a connecting stage, in order to produce an interaction.

Figure 12:
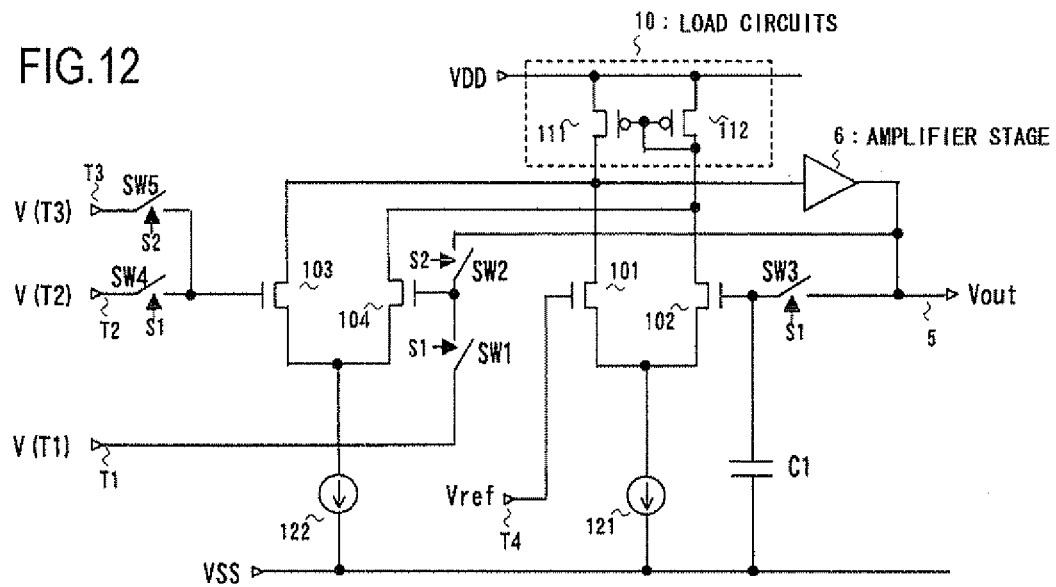
FIG. 12 is a diagram showing the configuration of a sixth embodiment of the present invention.

FIG. 12 shows a circuit corresponding to the differential amplifier of FIG. 1 formed by thin film transistors (TFTs). The thin film transistor is an insulated gate transistor formed on an insulating substrate formed e.g. of glass. The above-described operation and result may be achieved with a circuit employing such transistors.

In FIGS. 6 to 11, the circuit may, of course, be formed by thin film transistors with similar results.

The differential amplifier of the present invention is able to output the desired voltage to high accuracy without dependency on variations in transistor characteristics.

Moreover, the number of output voltages may be larger than the number of the input voltages, so that, with the digital-to-analog converter employing the differential amplifier of the present invention, the circuit size may be smaller than in the conventional system to achieve saving in chip area.

The present inventors have conducted further analyses in connection with the differential amplifier of the present invention, and have found that, depending on the conditions for circuit configuration, the slew rate of the output voltage sometimes undergoes variations. In the following, means for solving this inconvenience are explained in detail.

Figure 13:
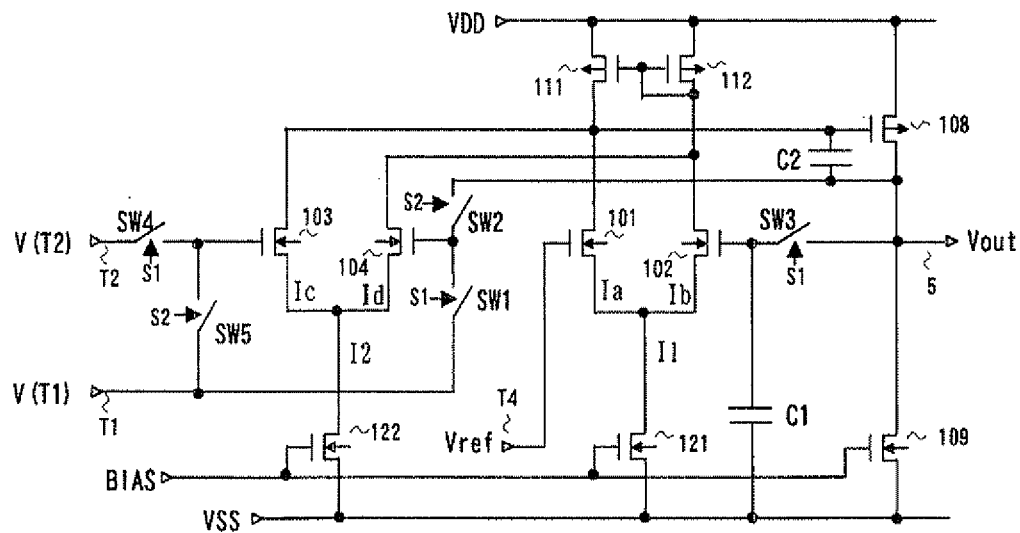
FIG. 13 is a diagram showing the configuration of a seventh embodiment of the present invention.

FIG. 13 is a diagram showing a circuit configuration of the conditions for simulation used for verifying the operation of the differential amplifier shown in FIG. 7. In FIG. 13, the current sources 121 and 122 are formed by NMOS transistors, the gates of which are supplied with a bias voltage BIAS. The amplifier stage 6 is formed by a PMOS transistor 108 and an NMOS transistor 109. The PMOS transistor 108 has a source connected to a high potential power supply VDD. The PMOS transistor 108 also has a gate connected to a common output end of the first differential pair (101, 102) and the second differential pair (103, 104), and has a drain connected to the output terminal 5, such that the transistor performs charging of the output terminal 5. The NMOS transistor 109 has a source connected to the low potential power supply VSS. The NMOS transistor also has a gate connected to the bias voltage BIAS and has a drain connected to the output terminal 5, such that the NMOS transistor performs a discharging the output terminal 5. For stabilizing the output voltage, a phase compensation capacity C2 is provided across the output terminal 5 and the connection node between the common output end of the first and second differential pairs and the gate of the transistor 108.

Figure 14:
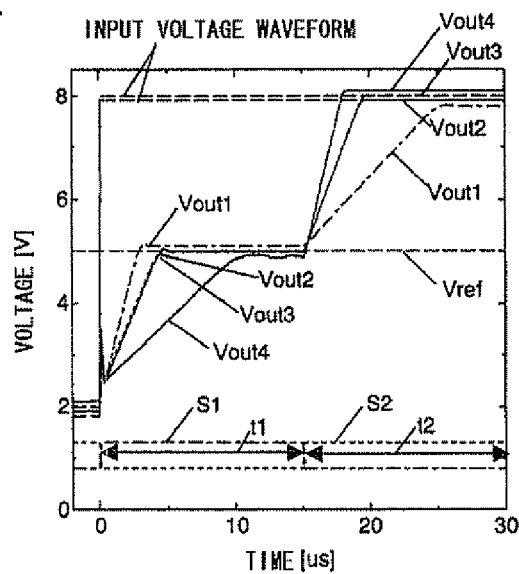
FIG. 14 is a waveform diagram for illustrating the operation of the seventh embodiment of the present invention.

FIG. 14 shows two levels of the input voltage waveforms (7.9V and 8.0V) for the power supply voltage of 10V and the reference voltage Vref=5V, and four output voltage waveforms Vout1 to Vout4, output in dependence upon the selecting conditions for V(T1) and VT(2), in the circuit shown in FIG. 13. The voltage waveforms Vout1 to Vout4 are waveforms in case V(T1) and VT(2) are selected to (7.9V, 8.0V), (7.9V, 7.9V), (8.0V, 8.0V) and to (8.0V, 7.9V), respectively. The timing chart for switches SW1 to SW5 is as shown in FIG. 2, such that the time periods t1 and t2 are 15 μs for one data period of 30 μs. It is noted that, in the voltage waveform diagram, the control signals S1 and S2 indicate the timing and are irrelevant to the voltage axis (ordinate).

Referring to FIG. 14, Vout1, Vout2, Vout3 and Vout4 are stable at 7.8V, 7.9V, 8.0V and 8.1V, respectively, at the time of end of one data period, thus testifying to the multi-valued outputting with the differential amplifier of the present invention. A high precision voltage output may be achieved even in case the transistor characteristics are changed slightly. On the other hand, in FIG. 14, the slew rate differs in dependence upon the voltage selecting conditions for V(T1) and V(T2) of the differential amplifier of FIG. 13. The results of analyses have indicated that these variations in the slew rate become outstanding in case the current of the current sources 121 and 122 driving the first and second differential pairs respectively is suppressed to a lower value in the configuration where a phase compensation capacity is directly connected to the common output end of the first and second differential pairs. The mechanism of these slew rate variations is now explained.

These variations in the slew rate, indicated in FIG. 14, are ascribable to the fact that the intensity of the action of changing the gate potential of the transistor 108 by the common output signal of the first and second differential pairs is varied by the voltage selecting conditions of V(T1) and V(T2) in FIG. 13. The intensity of the action is the degree of changes in the current flowing through the common output terminal of the first and second differential pairs.

In the configuration in which the phase compensation capacity is connected to the common output end of the first and second differential pairs, as in FIG. 13, the gate capacity of the transistor 108 and the phase compensation capacity must be charged/discharged simultaneously. Hence, the difference in the slew rate ascribable to the intensity of the above action becomes outstanding. This action is now explained. In the following, as in FIG. 1, the currents flowing through the transistors of the first differential pair (101, 102) and the second differential pair (103, 104) of the differential amplifier of FIG. 13 are labeled Ia, Ib, Ic and Id, respectively, and the currents flowing through the current sources 121 and 122 are labeled I1 and I2, respectively. It is assumed that, for simplicity, the transistor pairs of the first and second differential pairs are of the same characteristics, and that the transistors making up the circuit are free of variations in characteristics.

First, in the differential amplifier of FIG. 13, in which the first differential pair (101, 102) and the second differential pair (103, 104) are driven by the current sources 121 and 122, respectively, the following equations (6) and (7) hold under the stable operating state.

$$Ia+Ib=I1 \tag{6}$$

$$Ic+Id=I2 \tag{7}$$

The currents flowing through the current mirrors 111, 112 are equal to each other, so that the following equation (8) holds:

$$Ia+Ic=Ib+Id \tag{8}$$

Solving the above equations (6), (7) and (8), we have:

$$Ia+Ic=(I1+I2)/2 \quad (9)$$

$$Ib+Id=(I1+I2)/2 \quad (10)$$

The sum of Ia and Ic and the sum of Ib and Id are both constants prescribed by I1 and I2.

The operation of the first and second differential pairs during one data period shown in FIG. 14 is now considered. Directly after start of the period t1, the voltages V(T2) and V(T1) are supplied to the input pair of the second differential pair (103, 104), so that the currents Ic and Id become constant currents consistent with the voltages V(T2) and V(T1).

On the other hand, the input pair of the first differential pair (101, 102) is supplied with the reference voltage Vref and the output voltage Vout. Since Vout is lower than Vref, the current Ia is increased, whilst the current Ib is decreased. Since Ia is increased, the gate potential of the PMOS transistor 108 is pulled down to raise the output voltage Vout to close to the reference voltage Vref.

The increase in the current Ia affects the slew rate during the period t1 of FIG. 14.

From the equations (6) and (9), the width of change in the current Ia during the period t1 is given by the following equation:

$$I1 \geq Ia \geq \{(I1+I2)/2\} - Ic \quad (11)$$

In the above equation (11), the wider the range of the current Ia, the larger becomes the increment of the current Ia during the time period t1 and the higher the slew rate.

Scrutinizing into the voltage selecting conditions for the voltages VT(1), V(T2), supplied to the second differential pair (103, 104), the currents for VT(1)=V(T2) during the period t1 are such that $$Ic=Id=I2/2.$$

Consequently, the extent of the current Ia remains unchanged, even though the absolute values of VT(1) and V(T2) are changed, with the slew rate becoming constant.

Moreover, from the above equation (8), when Ic=Id, the first differential pair (101, 102) is in a stable state, such that Ia=Ib. Hence, the output voltage Vout during the period t1 is equipotential to the reference voltage Vref and is stable.

Referring to the waveform diagram of FIG. 14, Vout2 and Vout3 during the period t1 are of the same slew rate, equipotential to Vref and are stable.

On the other hand, if V(I1)>V(T2), the currents flowing through the second differential pair (103, 104) are such that Ic<Id.

At this time, the range of the current Ia of the above equation (11) is narrower than that for V(T1)=V(T2), so that the slew rate is lowered.

Moreover, from the above equation (8), when Ic<Id, the first differential pair (101, 102) is in a stable state, such that Ia>Ib. Hence, the output voltage Vout during the period t1 is lower in potential than the reference voltage Vref and is stable.

Referring to the waveform diagram of FIG. 14, Vout4 is lower in the slew rate than Vout2 and Vout3 during the period t1, such that Vout4 is lower in potential than Vref and is stable.

On the other hand, if V(T1)<V(T2), the currents flowing through the second differential pair (103, 104) are such that IC>Id.

At this time, the range of the current Ia of the above equation (11) is narrower than that for V(T1) V(T2), so that the slew rate is raised.

Moreover, from the above equation (8), when Ic>Id, the first differential pair (101, 102) is in a stable state, such that Ia<Ib. Hence, the output voltage Vout during the period t1 is higher in potential than the reference voltage Vref and is stable.

Referring to the voltage waveform diagram of FIG. 14, Vout1 during the period t1 is higher in the slew rate than Vout2 and Vout3 during the period t1, such that Vout1 is higher in potential than Vref and stable.

As for the operation of the first and second differential pairs during the period t2 of FIG. 14, the input pair of the first differential pair (101, 102) is supplied with the reference voltage Vref and with the output voltage (=Vout') at the end of the period t1, such that the currents Ia and Ib are constant currents. On the other hand, the input pair of the second differential pair (103, 104) is supplied with the voltage V(T1) and with the output voltage Vout. Since the output voltage Vout is lower in potential than the voltage V(T1), Ic and Id are increased and decreased, respectively.

As Ic is increased, the gate potential of the PMOS transistor 108 is pulled down, while the output voltage Vout is raised to close to V(T1).

The amount of the current increment of Ic at this time affects the slew rate during the period t2 of FIG. 14.

From the above equations (7) and (9), the width of change of the current Ic during the period t2 is given by the following equation:

$$I2 \geq Ic \geq \{(I1+I2)/2\} - Ia \quad (12)$$

In the above equation (12), the wider the width of the current Ic, the larger is the increment of the current Ic during the period t2 and the higher is the slew rate.

Regarding the relative values of the voltages Vref and Vout' supplied to the first differential pair (101, 102), the output voltage at the end of the period t1 is equipotential to the reference voltage Vref (Vout'=Vref) if V(T1)=V(T2). Hence, the relation of current values for the period t2 is given by $$Ia=Ib.$$

Consequently, the extent of the current Ic remains unchanged, as during the period t1, even though the absolute values of V(T1), V(T2) are changed, with the slew rate becoming constant.

Moreover, from the above equation (8), when Ia=Ib, the second differential pair (103, 104) is in a stable state, such that Ic=Id. Hence, the output voltage Vout during the period t2 is equipotential to the voltage V(T1) and is stable.

Referring to the waveform diagram of FIG. 14, Vout2 and Vout3 during the period t1 are of the same slew rate, with Vout2 and Vout3 being equal in potential to V(T1) and stable.

On the other hand, if V(T1)>V(T2), the output voltage at the close of the period t1 is lower than the reference voltage Vref (Vout'<Vref). Hence, the relation of the currents flowing through the first differential pair (101, 102) is such that Ia>Ib.

At this time, the range of the current Ic of the above equation (I2) is broader than that for V(T1) V(T2), so that the slew rate is higher.

Moreover, from the above equation (8), when Ia>Ib, the second differential pair (103, 104) is in a stable state, such that Ic<Id. Hence, the output voltage Vout during the period t2 is higher in potential than the voltage V(T1) and is stable.

Referring to the voltage waveform diagram of FIG. 14, Vout4 during the period t2 is higher in the slew rate than Vout2 and Vout3, such that Vout4 is higher in potential than V(T1) and is stable.

On the other hand, if V(T1)<V(T2), the currents flowing through the first differential pair (101, 102) during the period t2 are such that Ia<Ib, because the output voltage at the close of the period t1 is higher than the reference voltage Vref (Vout'>Vref). At this time, the range of the current Ic of the above equation (12) is narrower than that for V(T1)=V(T2), so that the slew rate is lowered.

Moreover, from the above equation (8), when Ia<Ib, the second differential pair (103, 104) is in a stable state, such that Ic>Id. Hence, the output voltage Vout during the period t2 is lower in potential than the voltage V(T1) and is stable.

In the voltage waveform diagram of FIG. 14, Vout1 during the period t2 is lower in the slew rate than Vout2 or Vout3, with Vout1 being lower in potential than the voltage V(T1) and is stable.

By the above operation, the slew rate of the differential amplifier of FIG. 13 differs depending on the selecting conditions of V(T1) and V(T2).

Meanwhile, in setting the reference voltage Vref at V(T1) or V(T2), the output voltage Vout is changed to close to the target voltage, during the period t1, so that the slew rate variations occur mainly during the period t1, with the potential variations of the output voltage Vout during the period t2 being sufficiently small. Hence, the effect of the slew rate variations during the period t2 may substantially be disregarded.

These slew rate variations by the voltage selecting conditions of V(T1), V(T2) may be ameliorated by such means as providing a circuit for controlling the activation or non-activation of at least one of the two current sources driving the first and second differential pairs, or providing a circuit for modulating and controlling the current values of the two current sources. An embodiment for these means is now explained.

Figure 15:
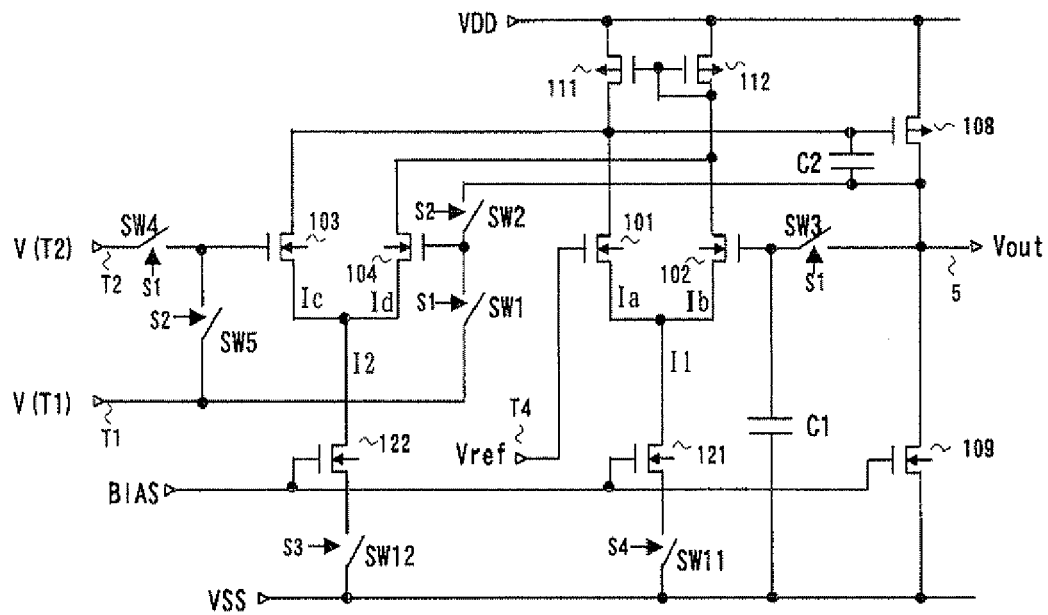
FIG. 15 is a diagram showing the configuration of an eighth embodiment of the present invention.

FIG. 15 shows a configuration in which the circuit for controlling the activation or non-activation of the current sources 121 and 122 is added to the differential amplifier of FIG. 13, and includes a switch SW11, connected in series with the current source 121, and a switch SW12, connected in series with the current source 122.

Figure 16:
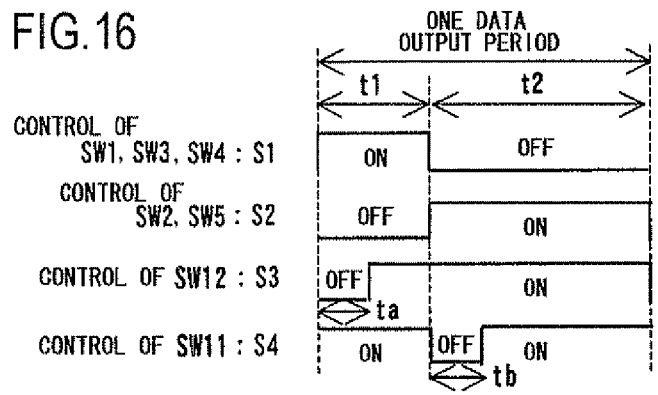
FIG. 16 is a timing diagram showing an example of switch control according to the eighth embodiment of the present invention.

FIG. 16 shows an example of on/off control of the switches SW1 to SW5, SW11 and SW12 in the configuration of FIG. 15.

In FIGS. 13 and 14, it has been indicated that, since the currents flowing through the transistors of the first and second differential pairs affect each other, and hence there may be occasions where the slue rate is changed depending on voltage selecting conditions of V(T1) and V(T2).

In the configuration of FIG. 15, the interaction of the currents flowing through the first and second differential pairs is transiently removed by the switches SW11, SW12 to suppress the slue rate variations. The specified operation is now explained.

FIG. 16 depicts an example of on/off control of the respective switches of FIG. 15. The control signals S1 and S2 are the same as those shown in FIG. 2. Referring to FIGS. 15 and 16, the operation of the switches SW11 and SW12 is explained.

Directly following the start of the period t1, a period ta is provided within the period t1. During this period ta, the switch SW12 is turned off by the control signal S3. The switch SW11 continues to be on throughout the period t1. By so doing, the current through the second differential pair (103, 104) during the period ta is cut off such that the operation of the second differential pair ceases.

The currents Ia and Ib flowing at this time through the first differential pair (101, 102) is determined by the current mirror circuit 111, 112. Assuming that there is no variation in transistor characteristics, the relationship as defined in the following equation (13) holds under the stable operating state.

$$Ia=Ib=I1/2 \quad (13)$$

From this, the width of change of the current Ia during the period ta is as indicated by the following equation (14):

$$I1 \geq = Ia \geq = I1/2 \quad (14)$$

Consequently, the slew rate is determined by the increment value of the current Ia of the above equation (14). Since the operation of the second differential pair (103, 104) is in cessation during the term ta, the slew rate is constant without dependency on the voltage selecting conditions of V(T1) and V(T2).

The period ta is set within the term t1, with the time of the output voltage Vout reaching the reference voltage Vref as an index.

After the close of the period ta, the switch SW12 is turned on and, during the remaining portion of the period t1, the output voltage (=Vout'), consistent with the voltage selecting condition of V(T1), V(T2), is stored in the capacitor C1, as in the case of FIG. 14.

Directly following the start of the period t2, a period tb is provided within the period t2. During this period tb, the switch SW11 is turned off by the control signal S4. The switch SW12 continues to be on throughout the period t2.

By so doing, the current through the first differential pair (101, 102) during the period tb is cut off such that the operation of the first differential pair ceases. The currents Ic and Id flowing at this time through the second differential pair (103, 104) is determined by the current mirror circuit (111, 112). Under the stable operating state, the relationship as define in the following equation (15) holds.

$$Ia=Ib=I1/2 \quad (15)$$

From this, the width of change of the current Ic during the period tb is as indicated by the following equation (16):

$$I2 \geq = Ic \geq I2/2 \quad (16)$$

Consequently, the slew rate is determined by the increment value of the current Ic of the above equation (16). Since the operation of the first differential pair (101, 102) is in cessation during the term ta, the slew rate is constant regardless of magnitude relationship between Vref and Vout'.

The period tb is set within the term t2, with the time of the output voltage Vout reaching the voltage V(T1) as an index.

After the close of the period tb, the switch SW11 is turned on and, during the remaining portion of the period t2, the output voltage is consistent with the voltage selecting condition of V(T1) and V(T2) at the terminals T1 and T2, as in the case of FIG. 14.

In the configuration shown in FIG. 15, described above, the switches SW11 and SW12 are provided and adapted to be controlled during the periods ta and tb provided within the periods t1 and t2, respectively, and hence the slew rate may be maintained constant without regard to the voltage selecting conditions of V(T1) and V(T2).

In case the reference voltage Vref is set to V(T1) or V(T2), the output voltage Vout is changed to close to the target voltage, during the period t1. Hence, the voltage variations of the output voltage Vout during the period t2 are sufficiently small. Consequently, the effect of slew rate variations during the term t2 is substantially negligible. In such case, it is unnecessary to control the switch SW11 and the period tb.

In FIG. 15, the circuit for controlling the active or inactive state of the current sources 121 and 122 is comprised of the switches SW11, SW12 connected in series with the current sources 121 and 122, respectively. However, another configuration may, of course, be used. For example, the active or inactive state of the current sources 121 and 122 may be controlled by changing the gate bias voltages of the current sources 121 and 122, respectively.

Figure 19:
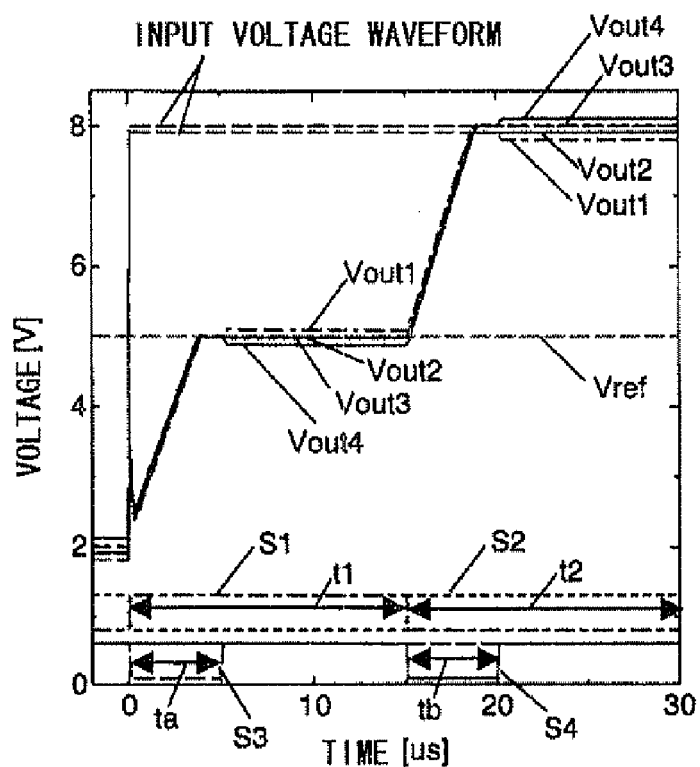
FIG. 19 shows the results of simulation of the eighth embodiment of the present invention.

FIG. 19 shows the results of simulation of the differential amplifier of FIG. 15. In FIG. 19, the voltage conditions and the time periods t1 and t2 are similar to those of FIG. 15 and the time periods ta and tb are both set to 5 μs.

From FIG. 19, the slew rates of the voltage waveforms Vout1 to Vout4 for the periods ta and tb are coincident with one another, indicating that, by the configuration of FIG. 15, it is possible to prevent slue rate variations which are dependent on the conditions of selecting V(T1) and V(T2).

Meanwhile, since the slew rate is rendered uniform, the period t1 may be optimized to a necessary minimum value, and hence the time until the output voltage Vout is driven to a target voltage during one data period may be shortened.

Figure 17:
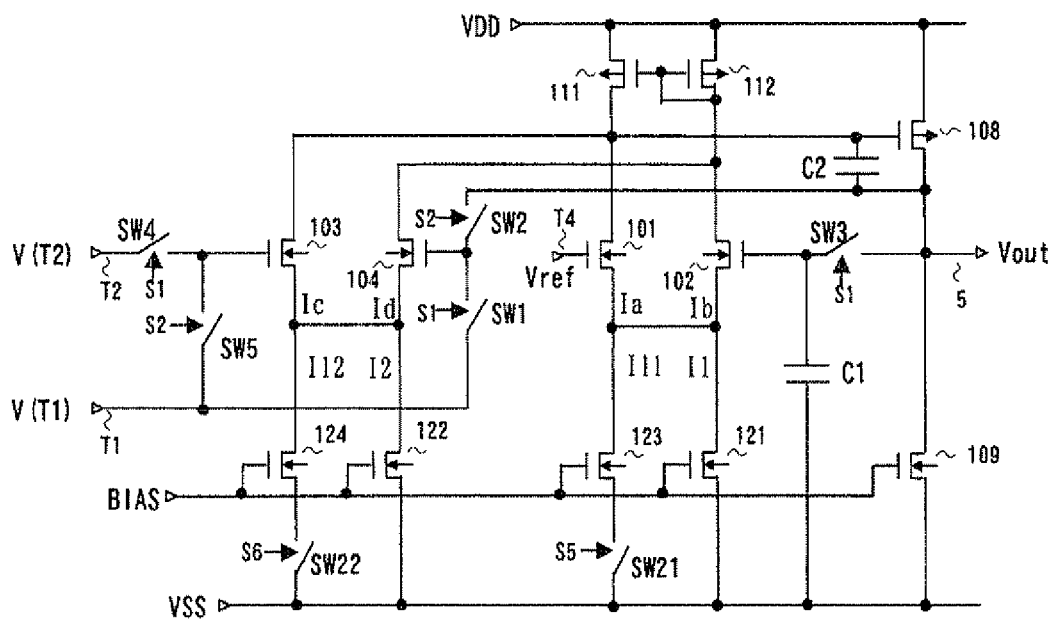
FIG. 17 is a diagram showing the configuration of a ninth embodiment of the present invention.

FIG. 17 shows a circuit configuration corresponding to the differential amplifier of FIG. 13 and added with a circuit for modulating the current driving the first and second differential pairs. More specifically, a current source 123 and a switch SW21, connected in series with each other, are connected parallel to the current source 121, whilst a current source 124 and a switch SW22, connected in series with each other, are connected parallel to the current source 122.

in the configuration shown in FIG. 17, the current driving the first and second differential pairs is modulated to suppress the interaction of the current flowing through the respective transistors of the first and second differential pairs, in order to suppress the slue rate variations. The specified operation is hereinafter explained.

Figure 18:
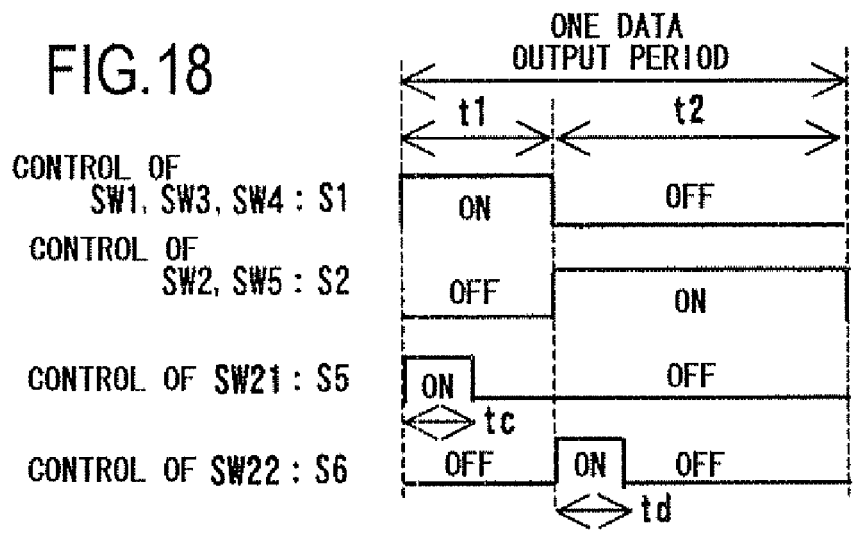
FIG. 18 is a timing diagram showing an example of switch control according to the ninth embodiment of the present invention.

FIG. 18 depicts a timing chart for controlling the switches shown in FIG. 17. The control signals S1 and S2 are the same as those shown in FIG. 2.

Within the periods t1 and t2, there are provided periods tc and td, respectively, and control signals S5 and S6 are provided which perform control in keeping with the timing of these periods.

Referring to FIGS. 17 and 18, the control of the switches SW21, SW22 is explained. First, during a period tc, directly following the period t1, the switch SW21 is turned on by the control signal S5. The switch SW22 continues to be off throughout the period t1.

By so doing, the current flowing through the first differential pair (101, 102) during the period to is increased. From the above equation (11), the width of change of the current Ia during the period to is given by:

$$I1+I11 \geq Ia \geq \{(I1+I2+I11)/2\}-Ic \qquad (17)$$

in accordance with the principle similar to that for FIG. 14. It is noted that the current of the current source 123 is a constant current I11.

It is seen from (17) above that, due to the newly added term of the current I11, the effect on the width of change of the current Ia of the current Ic varied with the selecting conditions for the voltages V(T1) and V(T2) becomes small. Consequently, the slue rate variations during the period tc also become small The period tc is set, within the period t1, with the time of the output voltage Vout reaching the vicinity of the reference voltage Vref as an index.

After the close of the period tc, the switch SW21 is turned off and, during the remaining portion of the period t1, the output voltage (=Vout'), consistent with the voltage selecting condition of V(T1) and V(T2), is stored in the capacitor C1, as in the case of FIG. 14.

Next, during a period td, directly following the period t2, the switch SW22 is turned on by the control signal S6. The switch SW21 continues to be off throughout the period t2.

By so doing, the current flowing through the first differential pair (103, 104) during the period td is increased. From the above equation (12), the width of change of the current Ic during the period td is given by:

$$I2+I12 \geq Ic \geq \{(I1+I2+I12)/2\}-Ia \qquad (18)$$

in accordance with the principle similar to that for FIG. 14. It is noted that the current of the current source 124 is the constant current I12.

It is seen from (18) above that, due to the newly added term of the current I12, the effect on the width of change of the current Ic of the current Ia varied with the magnitude of the voltage Vref and Vout' supplied to the first differential pair (101, 102) becomes small. Consequently, the slue rate variations during the period td also become small.

The period td is set within the term t2, with the time of the output voltage Vout reaching the vicinity of the voltage V(T1) as an index. After the close of the period td, the switch SW22 is turned off and, during the remaining portion of the period t2, the output voltage is consistent with the voltage selecting conditions for V(T1) and V(T2), as in FIG. 14.

The configuration shown in FIG. 17, described above, corresponds to the configuration of FIG. 13, added by the current sources 123 and 124 and the switches SW21 and SW22. These switches SW21 and SW22 are on/off controlled, during the periods tc and td, provided during the periods t1 and t2, respectively, to suppress slue rate variations, ascribable to the selection conditions for the voltages V(T1) and V(T2), in order to maintain the slue rate at an approximately constant value.

In case the reference voltage Vref is set to V(T1) or V(T2), the effect of slue rate variations during the period t2 may substantially be disregarded. In this case, it is unnecessary to control the switch SW22 and the period td.

The circuit shown in FIG. 17 is merely an example of the circuit for modulating the current driving the first differential pair (101, 102) and the second differential pair (103, 104). An alternative circuit configuration may, of course, be used. For example, in the circuit of FIG. 13, the current values of the current sources 121 and 122 may be modulated by varying the gate bias voltages of the current sources 121 and 122.

Figure 20:
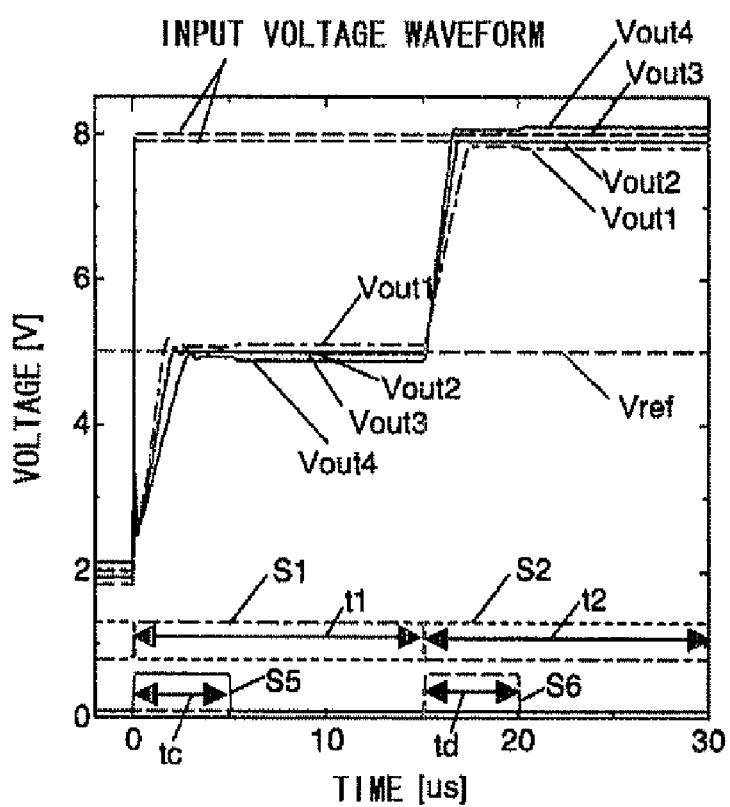
FIG. 20 shows the results of simulation of the ninth embodiment of the present invention.

FIG. 20 shows the results of simulation of the differential amplifier shown in FIG. 17. The voltage conditions and the periods t1 and t2 are the same as those shown in FIG. 14, and the periods to, td are set to 5 μs. It is seen from FIG. 20 that the slue rates of the voltage waveforms Vout1 to Vout4 during the periods tc and td are approximately coincident with one another, such that, with the configuration shown in FIG. 17, it is possible to prevent slue rate variations which are dependent on the selecting conditions of V(T1) and V(T2).

Since the slue rates have been rendered uniform, and the period t1 can be optimized to the necessary minimum time, it is possible to shorten the time during a data period when the output voltage Vout is driven to the target voltage.

Figure 21:
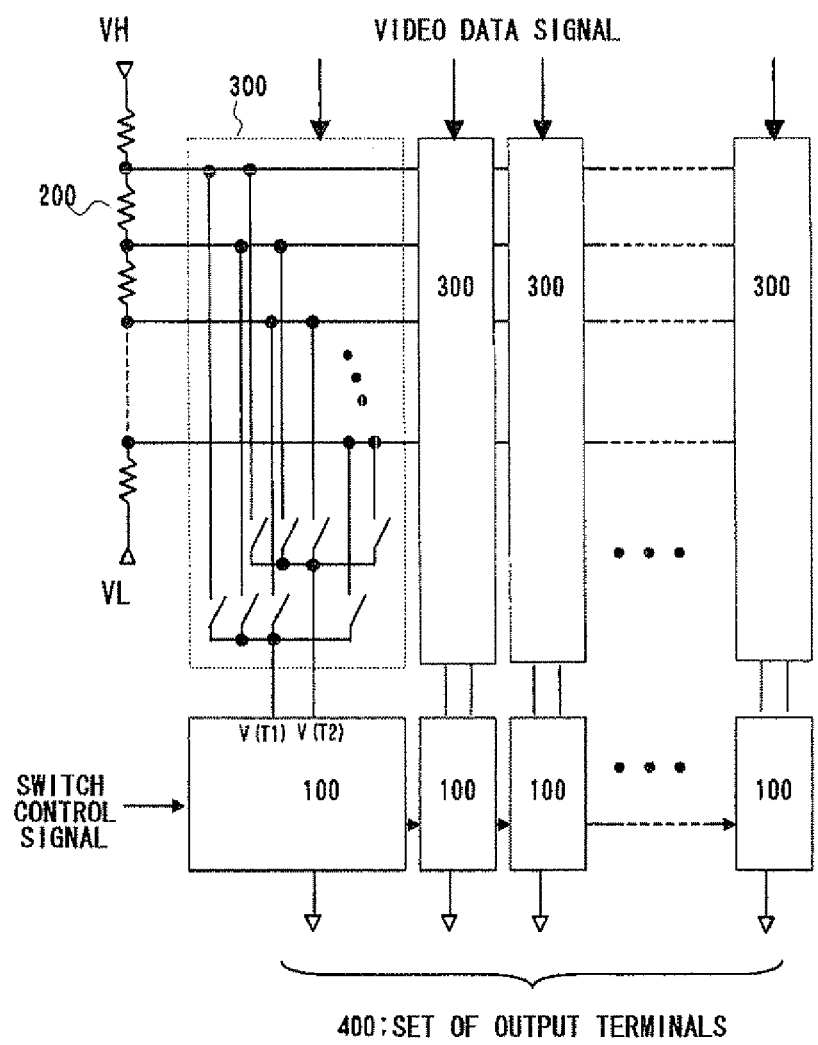
FIG. 21 is a diagram showing the configuration of a tenth embodiment of the present invention.
Figure 22:
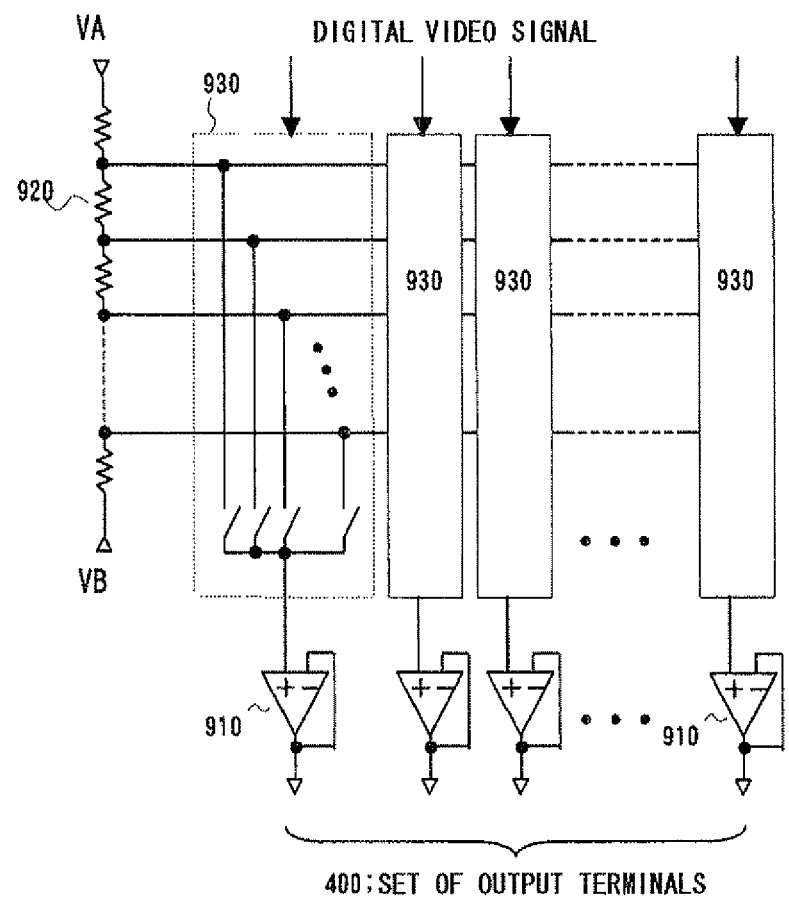
FIG. 22 is a diagram showing the configuration of a conventional display apparatus.
Figure 23:
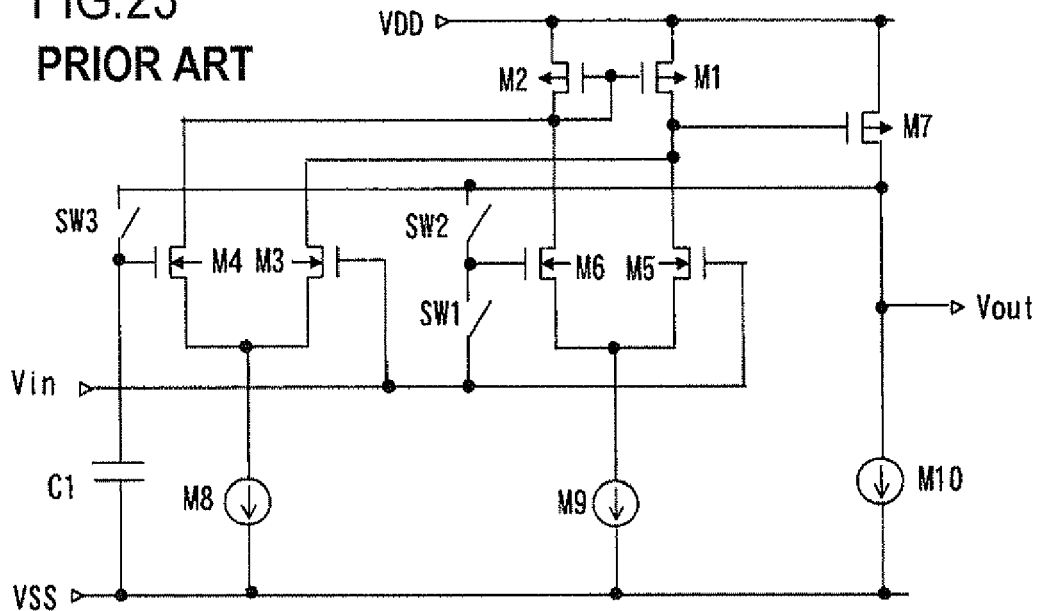
FIG. 23 is a diagram showing the configuration of a conventional differential amplifier.
Figure 24:
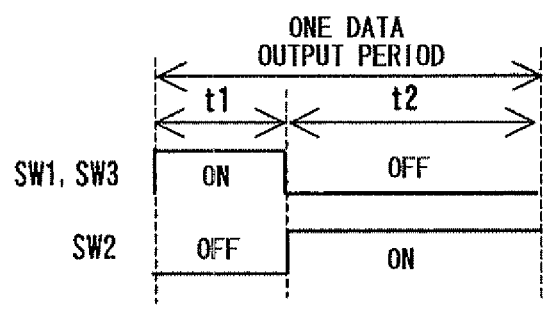
FIG. 24 is a timing diagram showing an example of switch control of FIG. 23.
Figure 25:
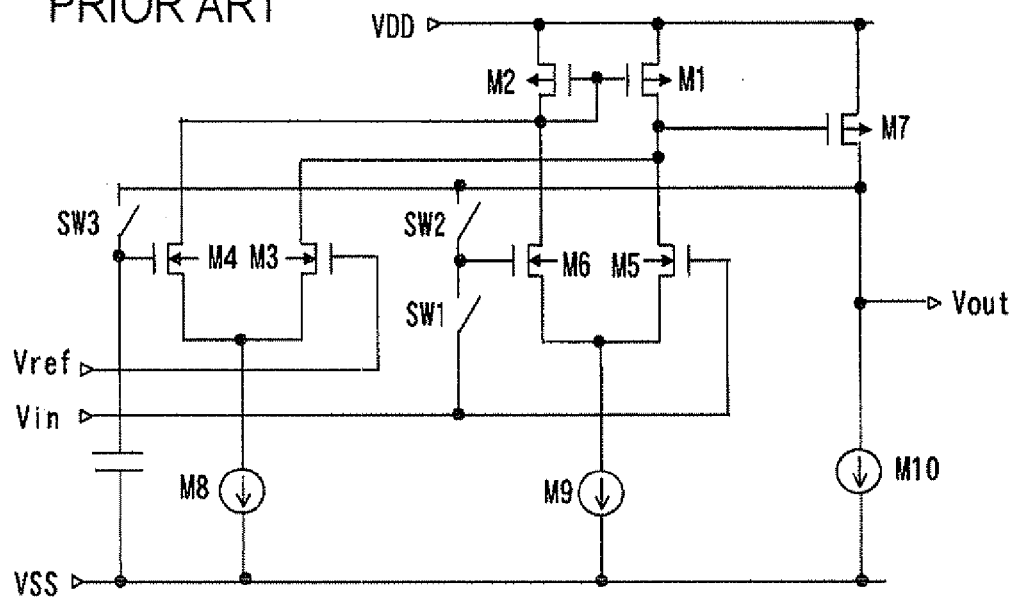
FIG. 25 is a diagram showing another configuration of a conventional differential amplifier.

FIG. 21 shows, as a modification of the present invention, the configuration of a data driver of a display apparatus, in which the digital-to-analog converter of FIG. 8 has been applied to a display apparatus. FIG. 21 depicts a block-based configuration, similarly to FIG. 22, and at least includes a grayscale voltage generating circuit 200, formed by plural resistor elements, a decoder 300 (selection circuit) and a buffer circuit 100. Similarly to the set of switches 32 of FIG. 8, the decoder 300 selects the voltages V(T1) and V(T2), responsive to the a video data signal, to output the so selected voltages to the buffer circuit 100.

The buffer circuit 100 may, for example, be a differential amplifier shown in FIG. 7. In this case, the data driver of FIG. 21 may output multiple values, by the buffer circuit 100, so that the number of the grayscale voltages, generated by the grayscale voltage generating circuit 200, may be smaller than in the configuration of FIG. 22. The result is that the circuit size of the decoder 300 and hence the chip size may be reduced.

The buffer circuit 100 is able to output the voltage to a high accuracy even in case variations in transistor characteristics are produced in the course of manufacture.

It is to be noted that the digital-to-analog converter shown in FIGS. 6 and 8 or the differential amplifiers of the respective embodiments may be applied to a data driver in accordance with the present invention.

Figure 26:
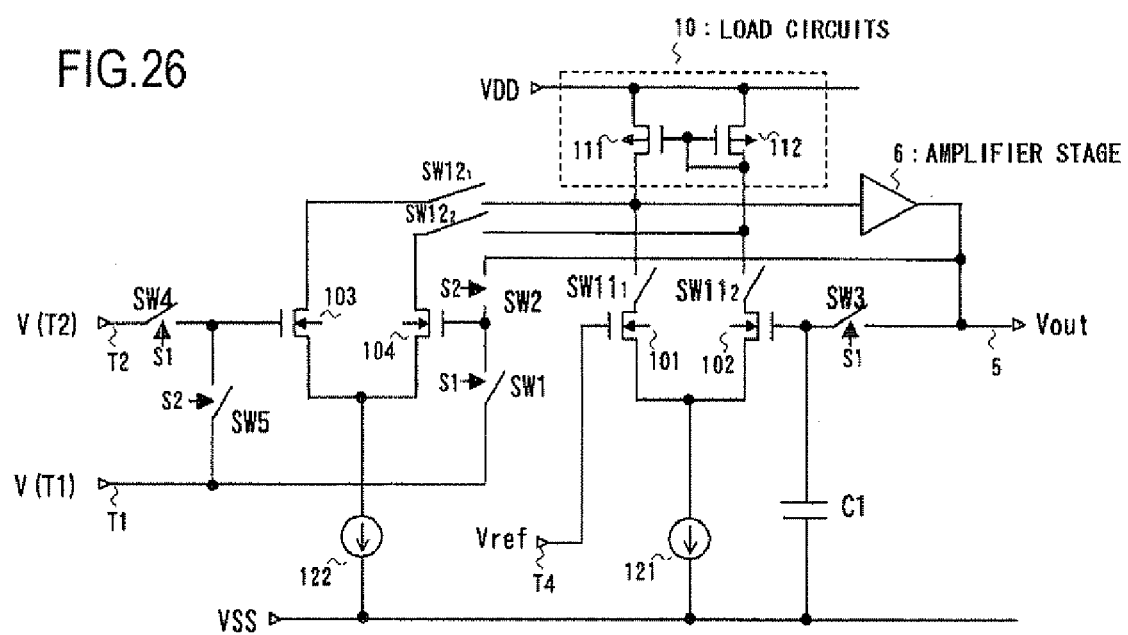
FIG. 26 is a diagram showing the configuration of an eleventh embodiment of the present invention.

Meanwhile, the configuration shown in FIG. 15 includes a circuit for controlling the activation/non-activation of the two current sources 121 and 122 supplying the constant current to the first and second differential pairs (101, 102) and (103, 104), respectively. The control of the activation/non-activation of the current sources 121 and 122 is substantially equivalent to the control of the activation/non-activation of the first differential pair (101, 102) and the second differential pair (103, 104). Consequently, the present invention may be designed to control the activation/non-activation of the first and second differential pairs. More specifically, a set of switches SW11$_1$ and SW11$_2$ and another set of switches SW12$_1$ and SW12$_2$ may be inserted between output pairs of the first and second differential pairs (101, 102) and (103, 104) and the current mirror (111, 112), in the configuration shown in FIG. 26, in order to control the activation of the differential pairs (101, 102) and (103, 104), that is, connection thereof to the current mirror circuit (111, 112), and the inactivation of the differential pairs (101, 102) and (103, 104), that is, disconnection from the current mirror circuit (111, 112). The input end of the amplifier stage 6 is connected at this time to an output end of the current mirror circuit 111, 112 (drain of the transistor 111). The switches SW11$_1$ and SW11$_2$ are simultaneously turned on or off in an interlocked fashion, based on an input control signal, and the other set of switches SW12$_1$ and SW12$_2$ are simultaneously turned on or off in an interlocked fashion, based on the input control signal. The control of the connection/disconnection by the switches SW12$_1$ and SW12$_2$ between the output pairs of the second differential pair (103, 104) and the current mirror circuit (111, 112) is managed by the control signal S3 shown for example in FIG. 16, such that, when the control signal S3 is at a high level, both the switches SW12$_1$, SW12$_2$ are turned on and, when the control signal S3 is at a low level, both the switches SW12$_1$ and SW12$_2$ are turned off. The control of the connection/disconnection by the switches SW11$_1$ and SW11$_2$ between the output pairs of the first differential pair (101, 102) and the current mirror circuit (111, 112) is managed by the control signal S4, shown for example in FIG. 16, such that, when the control signal S4 is at a high level, both the switches SW11$_1$ and SW11$_2$ are turned on and, when the control signal S4 is at a low level, both the switches SW11$_1$ and SW11$_2$ are turned off. The timing waveform of the control signals S1 to S4 during one data output period is as shown in FIG. 16.

Although the present invention has been explained with reference to preferred embodiments thereof, the present invention is not limited to these specified embodiments, and may, of course, encompass various changes or corrections that may come within the reach of those skilled in the art within the scope of the invention as defined in the claims.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modifications aforementioned.

What is claimed is:

1. A differential amplifier circuit comprising:
   an input differential stage including a first differential pair, second differential pair, and at least one load circuit connected to output pairs of said first and second differential pairs; and
   an amplifier stage, receiving a common output signal of said first and second differential pairs, for charging or discharging an output terminal;
   wherein a preset reference voltage is supplied to one of the differential inputs of said first differential pair; and
   wherein said differential amplifier circuit further comprises a control circuit for controlling the switching between
   a first state in which said output terminal is connected in a feedback fashion to the other of differential inputs of said first differential pair, the voltage at said output terminal is stored in a capacitor connected to the other of the differential inputs of said first differential pair, and first and second voltages are respectively supplied to differential inputs of said second differential pair, and
   a second state in which said output terminal is connected in a feedback fashion to one of differential inputs of said second differential pair, a third voltage is applied to the other of the differential inputs of said second differential pair, and the other of the differential inputs of said first differential pair is disconnected from said output terminal.

2. The differential amplifier circuit according to claim 1, wherein said third voltage is equivalent to one of said first voltage and said second voltage.

3. The differential amplifier circuit according to claim 1, wherein said reference voltage is a preset constant voltage in said first state of connection and in said second state of connection.

4. The differential amplifier circuit according to claim 1, wherein said reference voltage, supplied to the one of the differential inputs of said first differential pair, is one of said first, second and the third voltages.

5. The differential amplifier circuit according to claim 1, further comprising
   a circuit for controlling activation/non-activation of at least one of said first and second differential pairs.

6. The differential amplifier circuit according to claim 1, further comprising:
   first and second current sources for supplying currents to said first and second differential pairs respectively; and
   a circuit for controlling activation/non-activation of at least one of said first and second current sources.

7. A display apparatus including an amplifier circuit supplied with grayscale voltage and adapted for driving a data line connected to a display device; wherein
   the display apparatus comprises a differential amplifier circuit according to claim 1.

8. The differential amplifier circuit according to claim 1, wherein said output terminal outputs a voltage resulting from adding or subtracting a difference voltage between said first voltage and said second voltage to or from said third voltage.

9. A differential amplifier circuit comprising:
an input differential stage including a first differential pair, second differential pair, and a load circuit connected in common to said first and second differential pairs; and
first and second current sources for supplying currents to said first and second differential pairs respectively;
said differential amplifier circuit performing an amplification operation responsive to a common output signal of said first and second differential pairs;
wherein a preset reference voltage is supplied to one of the differential inputs of said first differential pair; and
wherein said differential amplifier circuit further comprises:
first, second and third input terminals;
an output terminal;
a first switch connected between the first input terminal and one of differential inputs of said second differential pair;
a second switch connected between one of the differential inputs of said second differential pair and the output terminal;
a third switch connected between the other of the differential inputs of said first differential pair and the output terminal;
a fourth switch connected between the second input terminal and the other of differential inputs of said second differential pair;
a fifth switch connected between the third input terminal and the other of differential inputs of said second differential pair; and
a capacitor connected to the other of the differential inputs of said first differential pair.

10. The differential amplifier circuit according to claim 9, wherein a data output period includes a first period and a second period;
wherein in said first period, said first, third and fourth switches are turned on, while said second and fifth switches are turned off;
voltages of the first and second input terminals are supplied through said first and fourth switches in an on-state, to the differential inputs of said second differential pair, respectively; and
the other of the differential inputs of said first differential pair is connected through said third switch in an on-state to the output terminal of said differential amplifier circuit, the voltage of the output terminal being stored in the capacitor; and
wherein in said second period, said first, third and fourth switches are all turned off, while said second and fifth switches are turned on, so that
one of differential inputs of said second differential pair is connected to the output terminal through said second switch in an on-state; and
the other of the differential inputs of said second differential pair is connected through said fifth switch in an on-state to the third input terminal.

11. The differential amplifier circuit according to claim 9, wherein said third input terminal and said first input terminal constitute a common input terminal.

12. The differential amplifier circuit according to claim 11, comprising;
wherein a data output period includes a first period and a second period;
wherein in said first period, said first, third and fourth switches are turned on, while said second and fifth switches are turned off;
voltages of the first and second input terminals are supplied through said first and fourth switches in an on-state, to differential inputs of said second differential pair, respectively; and
the other of the differential inputs of said first differential pair is connected to said third switch in an on-state to the output terminal of said differential amplifier circuit; the voltage of the output terminal being stored in the capacitor; and
wherein in said second period, said first, third and fourth switches are all turned off, while said second and fifth switches are turned on;
one of differential inputs of said second differential pair is connected to the output terminal through said second switch in an on-state; and
the other of the differential inputs of said second differential pair is connected through said fifth switch in an on-state to the first input terminal.

13. The differential amplifier circuit according to claim 9, wherein
an amplifier circuit performing an amplification operation responsive to a common output signal of said first and second differential pairs includes a differential amplifier stage having an input pair connected to a common connection node and to the other common connection node of output pairs of said first and second differential pairs and having an output end connected to said output terminal.

14. The differential amplifier circuit according to claim 9, further comprising
a circuit for controlling activation/non-activation of at least one of said first and second current sources.

15. The differential amplifier circuit according to claim 10, further comprising
a sixth switch connected between said second differential pair and a first power supply in series with said second current source, wherein said sixth switch is turned on after being turned off for a preset period as from the start of said first period of said data outputting period.

16. The differential amplifier circuit according to claim 10, further comprising
a series circuit including a sixth switch and a third current source connected in series between said first differential pair and a first power supply, said series circuit connected in parallel with said first current source, wherein said sixth switch is turned on off after being turned off on for a preset period as from the start of said first period of said data outputting period.

17. The differential amplifier circuit according to claim 10, further comprising
sixth and seventh switches for on/off controlling the connection across the output pair of said second differential pair and said load circuit, wherein said sixth and seventh switches are turned on after being turned off for a preset period as from the start of said first period of said data output period.

18. The differential amplifier circuit according to claim 10, further comprising:
a sixth switch connected between said first differential pair and a second first power supply in series with said first current source; and
a seventh switch connected between said second differential pair and said second first power supply in series with said current source,
wherein said seventh switch is turned on after being turned off for a preset period as from the start of said first period of said data outputting period; and wherein said sixth switch is turned off for a preset period as from the start of said second period and is turned on during a period other than said preset period as from the start of said second period of said data outputting period.

19. The differential amplifier circuit according to claim 10, further comprising:
   a first series circuit including a sixth switch and a third current source connected in series between said first differential pair and a first power supply, said first series circuit connected in parallel with said first current source; and
   a second series circuit including a seventh switch and a fourth current source connected in series between a common tail of said second differential pair and said first power supply, said second series circuit connected in parallel with said second current source,
   wherein said sixth switch is turned off after being turned on for a preset period as from the start of said first period of said data outputting period; and
   wherein said seventh switch is turned on for a preset period as from the start of said second period and is turned off during a period other than said preset period as from the start of said second period of said data outputting period.

20. The differential amplifier circuit according to claim 10, further comprising:
   sixth and seventh switches for on/off controlling the connection across the output pair of said first differential pair and said load circuit; and
   eighth and ninth switches for on/off controlling the connection across the output pair of said second differential pair and said load circuit,
   wherein said eighth and ninth switches are turned on after being turned off for a preset period as from the start of said first period of said data output period; and
   wherein said sixth and seventh switches are turned off for a preset period as from the start of said second period and are turned on during a period other than said preset period as from the start of said second period of said data output period.

21. The differential amplifier circuit according to claim 9, wherein said reference voltage, supplied to the one of the differential inputs of said first differential pair, is one of voltages of said first, second and third input terminals.

22. A digital-to-analog converter circuit comprising said differential amplifier circuit according to claim 9, said digital-to-analog converter circuit further comprising:
   a set of resistors connected in series across a first high-side potential and a second low-side potential; and
   a selection circuit supplied with a plurality of potentials from taps of said set of resistors to select the potentials to be supplied to said first, second and third input terminals based on a selection signal.

23. A display apparatus including an amplifier circuit supplied with grayscale voltage and adapted for driving a data line connected to a display device; wherein
   the display apparatus comprises a differential amplifier circuit according to claim 9.

24. The differential amplifier circuit according to claim 9, wherein said output terminal outputs a voltage resulting from adding or subtracting a difference voltage between voltages of said first and second input terminals to or from a voltage of said third input terminal.

25. A differential amplifier circuit comprising:
   an input differential stage including a first differential pair, second differential pair, and first and second load circuit connected to said first and second differential pairs respectively; and
   first and second current sources for supplying currents to said first and second differential pairs respectively;
   said differential amplifier circuit performing an amplification operation responsive to a common output signal of said first and second differential pairs,
   wherein a preset reference voltage is supplied to one of the differential inputs of said first differential pair; and
   wherein said differential amplifier circuit further comprises:
   first, second and third input terminals;
   an output terminal;
   a first switch connected between the first input terminal and one of differential inputs of said second differential pair;
   a second switch connected between one of the differential inputs of said second differential pair and the output terminal;
   a third switch connected between the other of the differential inputs of said first differential pair and the output terminal;
   a fourth switch connected between the second input terminal and the other of differential inputs of said second differential pair;
   a fifth switch connected between the third input terminal and the other of differential inputs of said second differential pair; and
   a capacitor connected to the other of the differential inputs of said first differential pair.

26. The differential amplifier circuit according to claim 25, wherein a data output period includes a first period and a second period;
   wherein in said first period, said first, third and fourth switches are turned on, while said second and fifth switches are turned off;
   voltages of the first and second input terminals are supplied through said first and fourth switches in an on-state, respectively, to differential inputs of said second differential pair; and
   the other of the differential inputs of said first differential pair is connected through said third switch in an on-state to the output terminal of said differential amplifier circuit; the voltage of the output terminal being stored in the capacitor; and
   wherein in said second period, said first, third and fourth switches are turned off, while said second and fifth switches are turned on;
   one of differential inputs of said second differential pair is connected to the output terminal through said second switch in an on-state; and
   the other of the differential inputs of said second differential pair is connected through the fifth switch in an on-state to the third input terminal.

27. A differential amplifier circuit comprising:
   first and second differential pairs of a first polarity;
   a load circuit of a second polarity connected in common to said first and second differential pairs;
   first and second current sources for supplying currents to said first and second differential pairs respectively;
   third and fourth differential pairs of the second polarity;
   a load circuit of the first polarity connected in common to said third and fourth differential pairs;
   third and fourth current sources for supplying currents to said third and fourth differential pairs;
   a first amplifier circuit for receiving a common output signal of said first and second differential pairs; and
   a second amplifier circuit for receiving a common output signal of said third and fourth differential pairs;

wherein differential inputs of said first and third differential pairs are connected together; and differential inputs of said second and fourth differential pairs are connected together;

wherein a reference voltage is supplied to one of differential inputs of said first and third differential pairs;

wherein said differential amplifier circuit further comprises;

first, second and third input terminals;

an output terminal;

a first switch connected between the first input terminal and one of the differential inputs of said second differential pair;

a second switch connected between one of the differential inputs of said second differential pair and the output terminal;

a third switch connected between the other of the differential inputs of said first differential pair and the output terminal;

a fourth switch connected between the second input terminal and the other of the differential inputs of said second differential pair;

a fifth switch connected between the third input terminal and the other of the differential inputs of said second differential pair; and a capacitor connected to the other of the differential inputs of said first differential pair.

28. The differential amplifier circuit according to claim 27, wherein a data output period includes a first period and a second period;

wherein in said first period, said first, third and fourth switches are all turned on, while said second and fifth switches are turned off;

voltages of the first and second input terminals are supplied through the first and fourth switches each being in an on-states, respectively, to one of the differential inputs of said second and fourth differential pairs; and the other of the differential inputs of said first and third to differential pairs is connected through said third switch in an on-state to the output terminal; the voltage of the output terminal being stored in the capacitor; and wherein in said second period, said first, third and fourth switches are all turned off, while said second and fifth switches are turned on;

one of the differential inputs of said second and fourth differential pairs is connected to the output terminal through said second switch in an on-state; and the other of the differential inputs of said second and fourth differential pairs is connected through the fifth switch to the third input terminal.

* * * * *